US008273520B2

(12) United States Patent
Sugasaki

(10) Patent No.: US 8,273,520 B2
(45) Date of Patent: Sep. 25, 2012

(54) RESIN COMPOSITION FOR LASER ENGRAVING, RELIEF PRINTING PLATE PRECURSOR FOR LASER ENGRAVING, RELIEF PRINTING PLATE AND METHOD OF PRODUCING THE SAME

(75) Inventor: Atsushi Sugasaki, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 313 days.

(21) Appl. No.: 12/360,857

(22) Filed: Jan. 28, 2009

(65) Prior Publication Data

US 2009/0191479 A1 Jul. 30, 2009

(30) Foreign Application Priority Data

Jan. 29, 2008 (JP) ................................ 2008-017882

(51) Int. Cl.
*G03F 7/00* (2006.01)

(52) U.S. Cl. ................. 430/270.1; 430/281.1; 430/306; 101/450.1

(58) Field of Classification Search ............... 430/270.1, 430/285.1, 306
See application file for complete search history.

(56) References Cited

U.S. PATENT DOCUMENTS

| | | | | |
|---|---|---|---|---|
| 4,458,006 | A | 7/1984 | Donges et al. | |
| 5,489,639 | A | 2/1996 | Faber et al. | |
| 6,093,779 | A * | 7/2000 | Van Der Schaaf et al. | 526/285 |
| 2003/0180636 | A1 | 9/2003 | Kanga et al. | |
| 2004/0157162 | A1 * | 8/2004 | Yokota et al. | 430/306 |
| 2005/0115920 | A1 | 6/2005 | Hiller et al. | |
| 2005/0227165 | A1 * | 10/2005 | Yamada et al. | 430/270.1 |
| 2006/0260481 | A1 | 11/2006 | Becker et al. | |
| 2008/0063979 | A1 * | 3/2008 | Tomita et al. | 430/287.1 |
| 2008/0070154 | A1 * | 3/2008 | Taguchi | 430/270.1 |
| 2008/0079795 | A1 * | 4/2008 | Nakazawa | 347/102 |
| 2008/0156212 | A1 * | 7/2008 | Yamada et al. | 101/375 |
| 2009/0176176 | A1 * | 7/2009 | Araki et al. | 430/286.1 |
| 2009/0191481 | A1 * | 7/2009 | Tashiro et al. | 430/306 |

FOREIGN PATENT DOCUMENTS

| | | | |
|---|---|---|---|
| EP | 1080883 | A2 | 3/2001 |
| EP | 1894957 | A1 | 3/2008 |
| JP | 3-075633 | A | 3/1991 |
| JP | 9-171247 | | 6/1997 |
| JP | 2773847 | | 7/1998 |
| JP | 2846954 | | 1/1999 |
| JP | 11-170718 | | 6/1999 |
| JP | 11-338139 | | 12/1999 |
| JP | 2000-168253 | | 6/2000 |
| JP | 2000-318330 | | 11/2000 |
| JP | 2002-357907 | | 12/2002 |
| WO | 02/16134 | A1 | 2/2002 |
| WO | WO 2007129704 | A1 * | 11/2007 |

OTHER PUBLICATIONS

Office Action issued on Oct. 14, 2010, for U.S. Appl. No. 12/497,557.
Office Action issued on Mar. 11, 2011, for U.S. Appl. No. 12/497,557.

* cited by examiner

*Primary Examiner* — Cynthia Kelly
*Assistant Examiner* — Chanceity Robinson
(74) *Attorney, Agent, or Firm* — SOLARIS Intellectual Property Group, PLLC

(57) ABSTRACT

The present invention provides a resin composition for laser engraving containing at least an acetylene compound and a binder polymer, a relief printing plate precursor for laser engraving using the same, a relief printing plate, and a method for producing a relief printing plate.

7 Claims, No Drawings

RESIN COMPOSITION FOR LASER ENGRAVING, RELIEF PRINTING PLATE PRECURSOR FOR LASER ENGRAVING, RELIEF PRINTING PLATE AND METHOD OF PRODUCING THE SAME

CROSS-REFERENCE TO RELATED APPLICATION

This application claims priority under 35 USC 119 from Japanese Patent Application No. 2008-017882, the disclosure of which is incorporated by reference herein.

BACKGROUND OF THE INVENTION

1. Field of the Invention

The present invention relates to a resin composition for laser engraving, a relief printing plate precursor for laser engraving, a relief printing plate, and a method of producing a relief printing plate.

2. Description of the Related Art

As a method for forming a printing plate by forming a concave-convex structure on a photosensitive resin layer laminated on the surface of a support, a method of exposing a relief forming layer which has been formed using a photosensitive composition, to ultraviolet radiation through an original image film so as to selectively cure image areas, and removing uncured parts by means of a developer solution, that is, so-called "analogue plate making", is well known.

A relief printing plate is a letterpress printing plate having a relief layer with a concave-convex structure, and such a relief layer having a concave-convex structure may be obtained by patterning a relief forming layer formed from a photosensitive composition containing, as a main component, for example, an elastomeric polymer such as synthetic rubber, a resin such as a thermoplastic resin, or a mixture of a resin and a plasticizer, to thus form a concave-convex structure. Among such relief printing plates, a printing plate having a flexible relief layer is often referred to as a flexo plate.

In the case of producing a relief printing plate by analogue plate making, since an original image film using a silver salt material is needed in general, the plate making process requires time and costs for the production of original image films. Furthermore, since chemical treatments are required in the development of original image films, and also treatments of development waste water are necessary, investigations on simpler methods of plate making, for example, methods which do not use original image films or methods which do not necessitate development treatments, are being undertaken.

In recent years, a method of making a plate having a relief forming layer by means of scanning exposure, without requiring an original image film, is being investigated. As a technique which does not require an original image film, there has been proposed a relief printing plate precursor in which a laser-sensitive type mask layer element capable of forming an image mask is provided on a relief forming layer (see, for example, Japanese Patent No. 2773847 and Japanese Patent Application Laid-Open (JP-A) No. 9-171247). The method of making such a plate precursor is referred to as a "mask CTP method", because an image mask having the same function as the original image film is formed from the mask layer element by means of laser irradiation that is based on image data. This method does not require an original image film, but the subsequent plate making treatment involves a process of exposing the plate precursor to ultraviolet radiation through an image mask, and then removing uncured parts by development, and from the viewpoint of requiring a development treatment, the method has a room for further improvement.

As a method of plate making which does not require a development process, a so-called "direct engraving CTP method", in which plate making is carried out by directly engraving a relief forming layer using laser, has been proposed a number of times. The direct engraving CTP method is literally a method of forming a concave-convex structure which will serve as relief, by engraving the structure with laser. This method is advantageous in that the relief shape can be freely controlled, unlike the relief formation processes using original image films. For this reason, in the case of forming images like cutout characters, it is possible to engrave the image regions deeper than other regions, or for microdot images, to carry out shouldered engraving in consideration of resistance to the printing pressure, or the like. However, in this method, since high energy is required to form a relief having a concave-convex structure which can withstand the printing pressure, on a relief forming layer having a predetermined thickness, and the speed of laser engraving is slow, the method has a problem of low productivity as compared to the methods in which image formation involves the use of a mask.

For this reason, it has been attempted to enhance the sensitivity of a relief printing plate precursor. For example, a flexographic printing plate precursor for laser engraving which includes an elastomer foam has been proposed (see JP-A No. 2002-357907). In this technology, an attempt is made to improve the engraving sensitivity by using a low density foamed material in a relief forming layer. However, due to being a foamed material having low density, the obtained printing plate has problems such as lack of strength, and seriously impaired print durability.

Japanese Patent No. 2846954, and JP-A Nos. 11-338139 and 11-170718 disclose flexographic printing plate precursors which make possible of laser engraving, or flexo plates obtained by laser engraving. According to these documents, flexo plates are obtained by incorporating a monomer as a binder into an elastomeric rubber, curing the mixture by means of a thermopolymerization mechanism or photopolymerization mechanism, and then performing laser engraving thereon.

As a problem faced by the direct engraving CTP method, the slow speed of laser engraving may be mentioned. This is because in the mask CTP method, the thickness of the mask layer element of a subject requiring abrasion is only about 1 μm to 10 μm, whereas in the direct engraving CTP method, it is necessary to engrave at least 100 μm in view of the function of directly forming a relief. Therefore, there have been several suggestions attempting to improve the laser engraving sensitivity.

For example, a flexographic printing plate precursor for laser engraving which contains an elastomer foam has been proposed (see JP-A No. 2000-318330). In this technology, an attempt is made to improve the engraving sensitivity by using a low density foamed material; however, due to being a foamed material having low density, the obtained printing plate has problems such as the lack of strength, and seriously impaired print durability.

In another example, a flexographic printing plate precursor for laser engraving which contains microspheres encapsulating a hydrocarbon-based gas has been proposed (see U.S. Patent Application Laid-Open No. 2003/180636). In this technology, an attempt is made to improve the engraving sensitivity by means of a system in which the gas inside the microspheres expands under the heat generated by laser, and disintegrates the material being engraved. However, due to being a material system containing gas bubbles, the microsphere system has a problem that the obtained printing plate is likely to lack the strength. Furthermore, since a gas has a nature of being more likely to expand under heat than solids, even though microspheres having a high thermal deformation initiation temperature are selected, volume changes due to the changes in the outside temperature are unavoidable. Therefore, it is not appropriate to use a material containing gas bubbles in the printing plates where stability in the thickness precision is required.

In still another example, a resin letterpress printing plate for laser engraving which contains a polymeric filler having a ceiling temperature of less than 600 K has been proposed (see JP-A No. 2000-168253). In this technology, an attempt is made to improve the engraving sensitivity by adding a polymeric filler having a low depolymerization temperature. However, when such a polymeric filler is used, surface irregularities are generated on the surface of the printing plate precursor, and seriously affect the printing quality.

As discussed above, a variety of technologies have been proposed in relation to a resin composition which can be suitably used in the relief forming layer of relief printing plate precursors for laser engraving, but under the current situation, a resin composition exhibiting high engraving sensitivity when submitted to laser engraving, is yet to be provided.

SUMMARY OF THE INVENTION

The present invention has been made in view of the circumstances described above.

A first aspect of the present invention is to provide a resin composition for laser engraving which contains at least an acetylene compound and a binder polymer.

A second aspect of the present invention is to provide a relief printing plate precursor for laser engraving which has a relief forming layer including the resin composition for laser engraving the present invention.

A third aspect of the present invention is to provide a method for producing a relief printing plate, which includes (1) crosslinking the relief forming layer in the relief printing plate precursor for laser engraving the present invention by at least one of light or heat; and (2) laser engraving the crosslinked relief forming layer to form a relief layer.

A fourth aspect of the present invention is to provide a relief printing plate having a relief layer, which is produced by the method of producing a relief printing plate of the present invention.

DETAILED DESCRIPTION OF THE INVENTION

Hereinafter, the resin composition for laser engraving, the relief printing plate precursor for laser engraving, the relief printing plate and the method of producing a relief printing plate of the present invention will be described in detail. In the present specification, a phrase "... to ..." represents a range including the numeral values represented before and after "to" as a minimum value and a maximum value, respectively.

1. Resin Composition for Laser Engraving

The resin composition for laser engraving of the present invention contains at least an acetylene compound and a binder polymer (hereinafter, the resin composition for laser engraving of the present invention may also be referred to as a resin composition of the present invention).

Since the resin composition of the present invention has high engraving sensitivity when subjected to laser engraving, the laser engraving process may be performed at a high speed, and thus the engraving time may also be shortened. The resin composition of the present invention having this feature is not particularly limited to use in the formation of a resin molded article on which laser engraving is provided, and may be applied to a wide range of uses. For example, specific applications of the resin composition of the present invention may include a relief forming layer of a printing plate precursor on which convex-shaped relief formation is carried out by laser engraving, an intaglio printing plate, a porous printing plate, a stamp, and the like, although possible applications are not limited to these. The resin composition of the present invention may be particularly suitably used for the relief forming layer in a relief printing plate precursor for laser engraving. Hereinafter, the constituent elements of the resin composition for laser engraving will be discussed.

(A) Acetylene Compound

The resin composition of the present invention contains an acetylene compound. The "acetylene compound" as used in the present invention means a compound having at least one carbon-carbon triple bond in a molecular structure.

The number of carbon-carbon triple bonds in the molecular structure of the acetylene compound is preferably one to five, more preferably one to three, and particularly preferably one or two, per molecule, from the viewpoint of balancing between thermal stability and engraving sensitivity at the time of producing a film of the resin composition.

The position of the carbon-carbon triple bond in the molecular structure of the acetylene compound may be either in the interior of the molecule or at the ends of the molecule. If the number of the carbon-carbon triple bonds in the acetylene compound is two or more, the compound may have the carbon-carbon triple bonds only in the inner part of the molecule, or the compound may also have the carbon-carbon triple bonds both in the inner part of the molecule and at the ends of the molecule.

From the viewpoint of balancing between thermal stability and engraving sensitivity at the time of film forming, the position of the carbon-carbon triple bond in the molecular structure of the acetylene compound is preferably at an end of the molecule if the number of the carbon-carbon triple bond present in the molecule is one, and the position is preferably in the interior of the molecule if the number of the carbon-carbon triple bonds present in the molecule is two or more.

Here, the case where an acetylene compound has a carbon-carbon triple bond in the interior of the molecule, means specifically that the acetylene compound has the structure of $R—C{\equiv}C—R$. The case where an acetylene compound has a carbon-carbon triple bond at an end of the molecule, means that the acetylene compound has the structure of $R—C{\equiv}C—H$. Here, R represents a monovalent non-metal atomic group excluding hydrogen atoms. Examples of the monovalent non-metal atomic group include an alkyl group, an aryl group, an acyl group, a heterocyclic group, an amino group, a silyl group, an alkynyl group, and the like, and these groups may further be substituted. It is preferable for R to have a hydrophilic group as a substituent from the viewpoint of having excellent compatibility with polyvinyl alcohol and derivatives thereof, which are preferable examples of the binder polymer in the present invention, and examples of such R include an alkyl group or aryl group having a hydroxyl group, and an alkyl group or aryl group having a sulfonamide group, with an alkyl group having a hydroxyl group being preferred.

Regarding solvent solubility of the acetylene compound, it is preferable that the acetylene compound be soluble or dispersible in water or alcohol. That the acetylene compound is soluble or dispersible in water or alcohol, is preferable from the viewpoint of using the acetylene compound in combination with a hydrophilic polymer, which is a suitable aspect of the (B) binder polymer in the present invention.

The molecular weight of the acetylene compound is preferably 50 to 3000, more preferably 100 to 2000, and even more preferably 120 to 1000, from the viewpoints of engraving sensitivity and film formability.

The acetylene compound preferably does not have an aromatic group, from the viewpoint of securing the flexibility of the film produced from the resin composition for laser engraving.

The operating mechanism of the acetylene compound in the resin composition for laser engraving of the present invention is not certain, but is presumed as follows.

An acetylene compound has a carbon-carbon triple bond area which is in a high energy state in its molecular structure. For this reason, when the resin composition for laser engraving of the present invention is formed into a film, and laser engraving is performed thereon, that is, when thermal decomposition or combustion occurs, stabilization energy associated with oxidation is released, and this released energy is added to the energy resulting from laser irradiation. As a consequence, it is presumed that, compared to a case where the acetylene compound is not added, the degree of thermal decomposition of the film becomes larger even when using the same laser energy, and consequently, engraving sensitivity is improved.

Hereinafter, specific examples of the acetylene compound according to the present invention will be exemplified, but the examples are not intended to be limited to these.

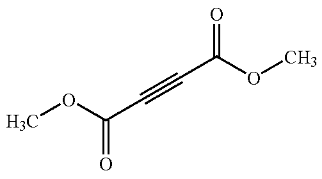
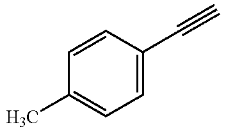
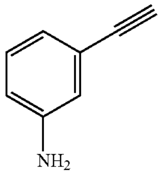
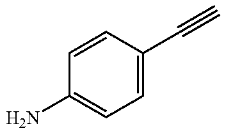
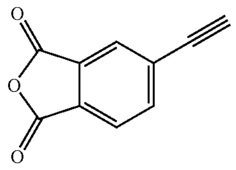
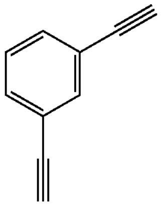
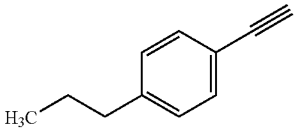
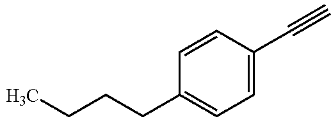

-continued

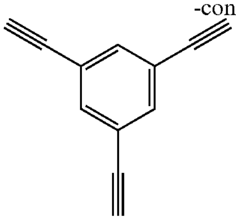
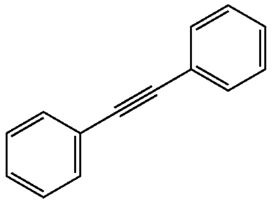
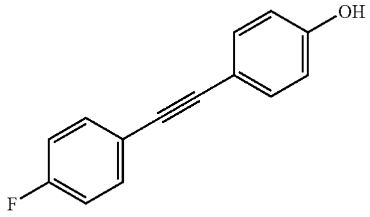
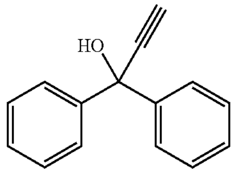
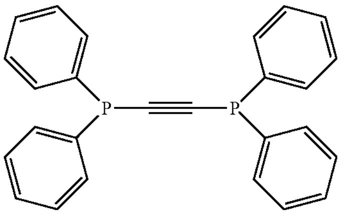
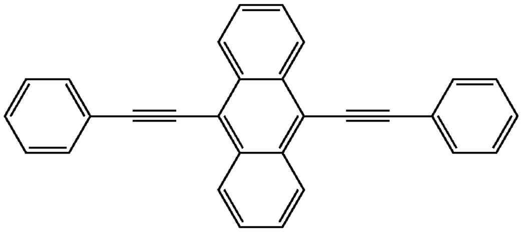
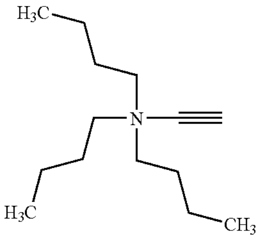
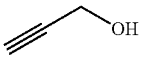
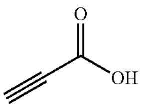
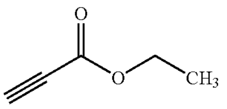
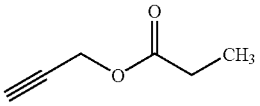
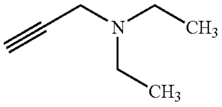
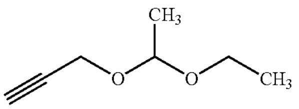

-continued
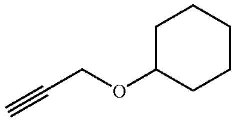
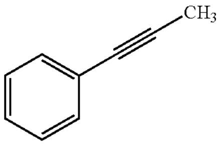
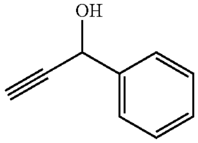
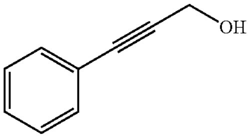
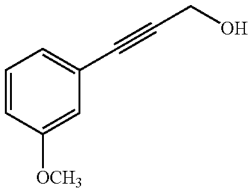
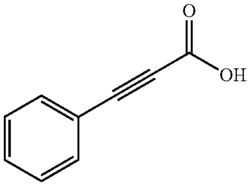
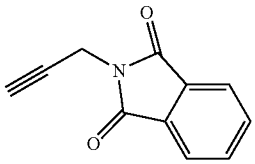
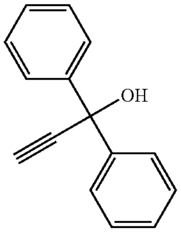
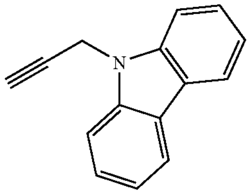
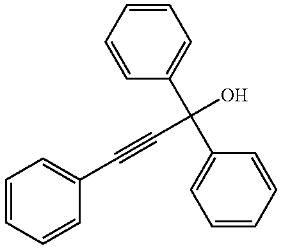
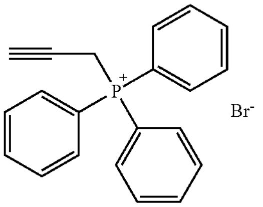
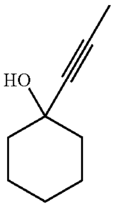
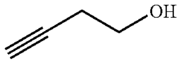
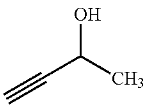
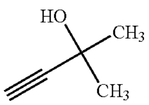
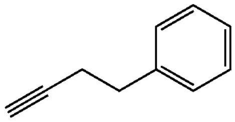
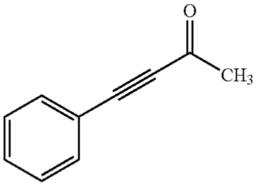
-continued
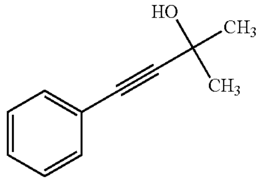
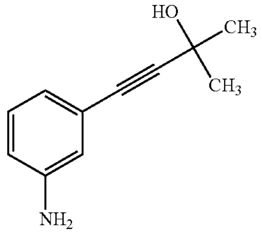
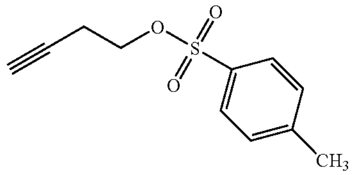
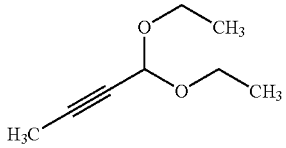
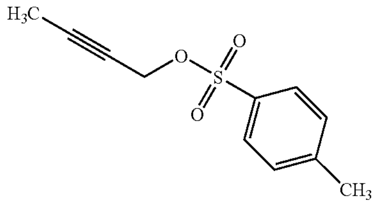
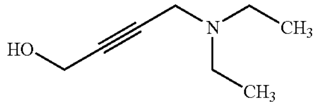
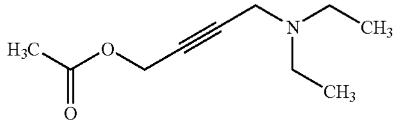
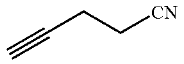
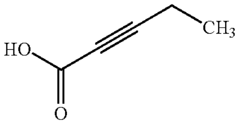
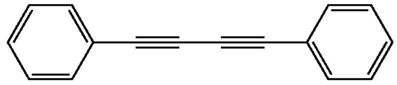
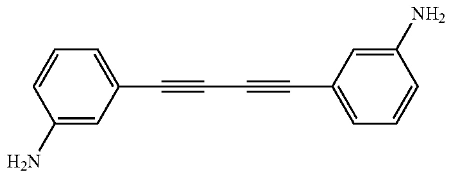
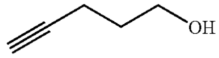
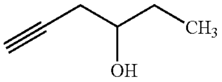
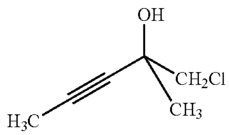
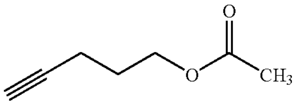

-continued
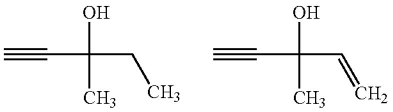
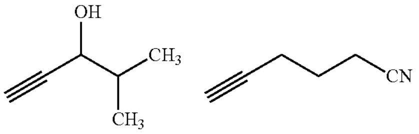
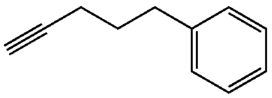
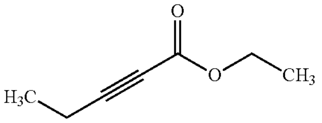
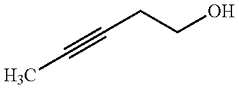
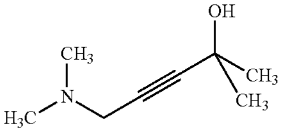
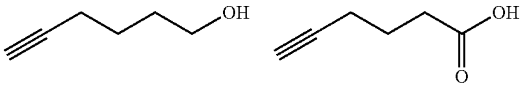
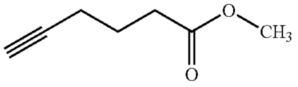
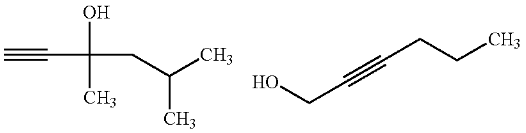
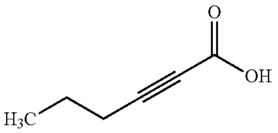
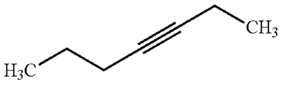
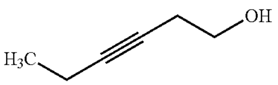
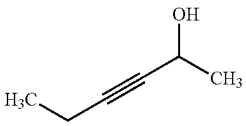
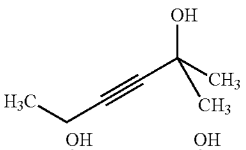
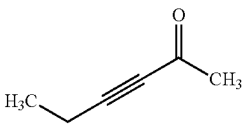
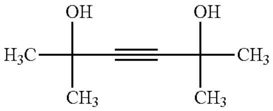
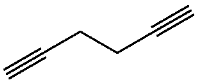
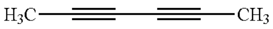
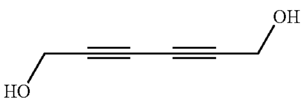
-continued
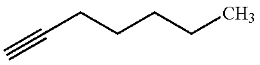
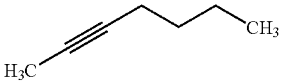
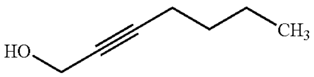
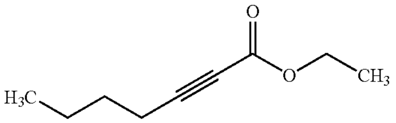
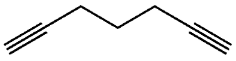
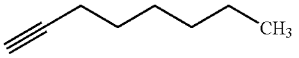
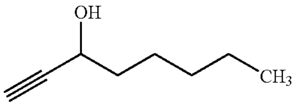
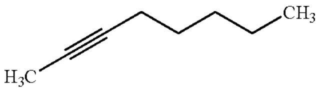
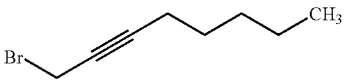
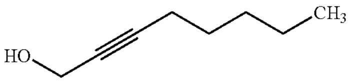
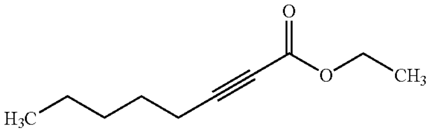
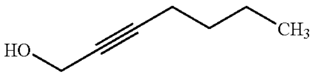
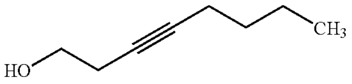
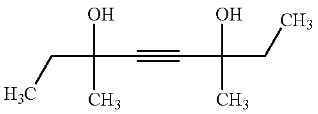
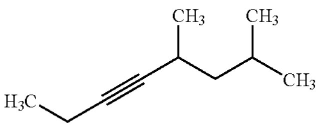
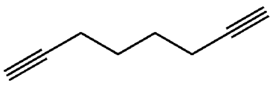
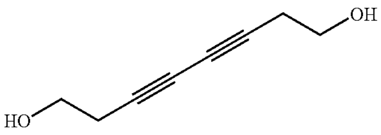

-continued
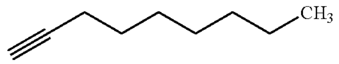
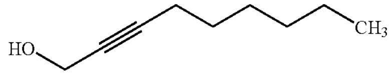
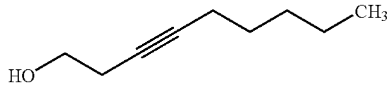
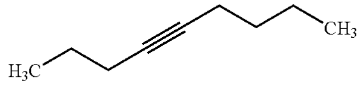
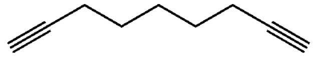
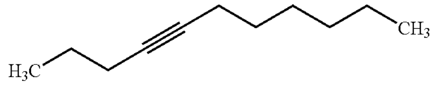
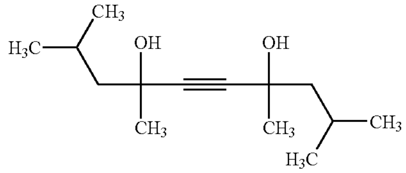
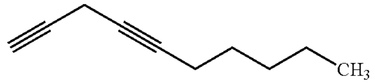
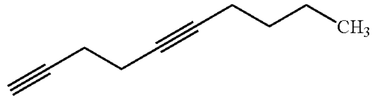
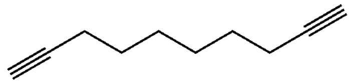
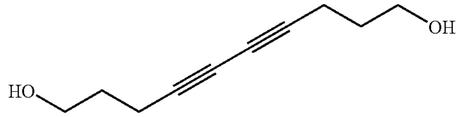
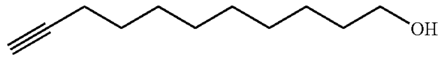
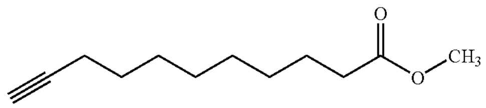
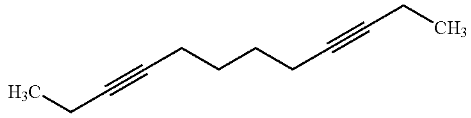
-continued
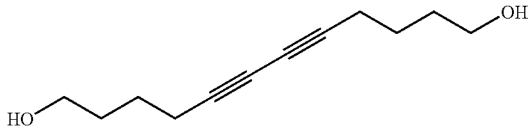
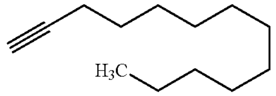
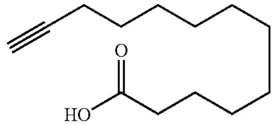
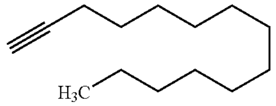
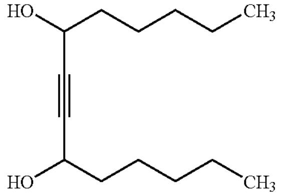
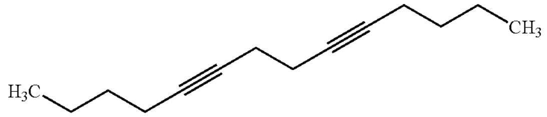
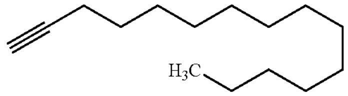
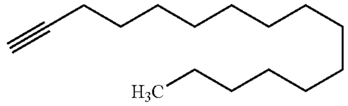
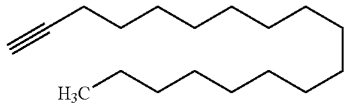
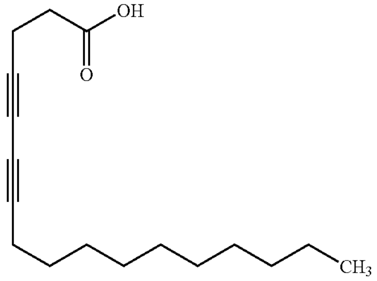
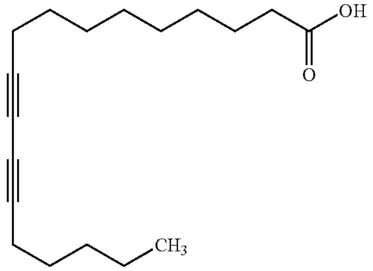

-continued

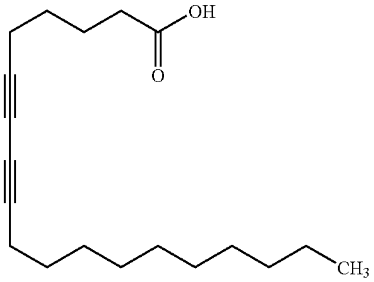

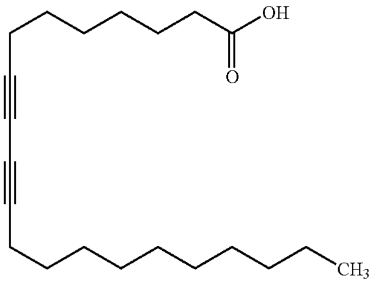

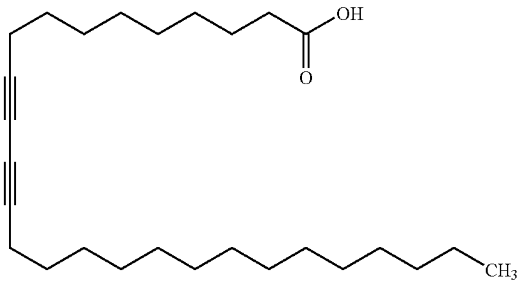

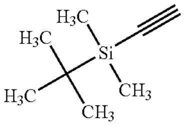

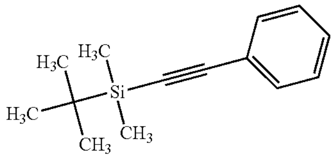

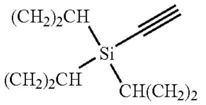

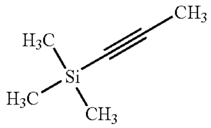

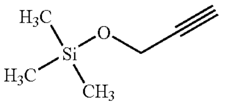

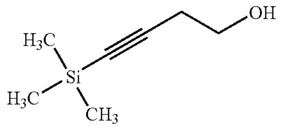

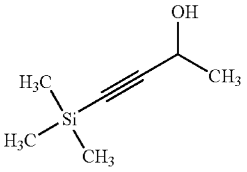

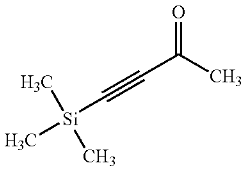

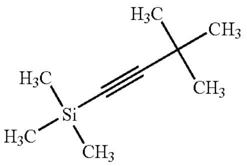

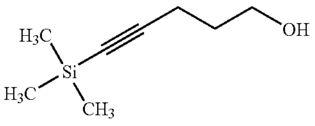

-continued

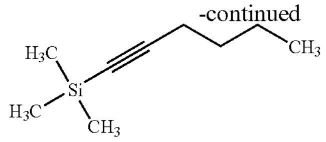

The content of the acetylene compound in the resin composition for laser engraving of the present invention is preferably in the range of from 1 to 30% by mass, more preferably in the range of from 1 to 20% by mass, and even more preferably in the range of from 1 to 10% by mass, relative to the total mass of a binder polymer in the composition.

(B) Binder Polymer

The resin composition for laser engraving of the present invention contains a binder polymer. The binder polymer is a main component contained in the resin composition for laser engraving, and generally, a thermoplastic resin, a thermoplastic elastomer and the like are used in accordance with the purpose, from the viewpoint of the recording sensitivity to the laser. For example, in the case of using the binder polymer for the purpose of curing the binder polymer by heating or exposure and enhancing strength, a polymer having carbon-carbon unsaturated bonds in the molecule is selected as the binder polymer. In the case of using the binder polymer for the purpose of forming a pliable film having flexibility, a soft resin or a thermoplastic elastomer is selected as the binder polymer.

In the case of applying the resin composition for laser engraving to the relief forming layer in a relief printing plate precursor for laser engraving, it is preferable to use a hydrophilic or alcoholphilic polymer as the binder polymer, from the viewpoints of the ease of preparation of a composition for relief forming layer, and an improvement of the resistance to oily ink in the obtained relief printing plate.

Also, from the viewpoint of laser engraving sensitivity, a polymer including a partial structure which thermally degrades by exposure or heating, is preferred.

As such, in this invention, binder polymers may be selected in accordance with the purpose, while taking into consideration of the properties according to the applications of the resin composition for laser engraving, and one species or a combination of two or more species of such binder polymers may be used.

The total amount of the binder polymer in the resin composition for laser engraving is preferably 1 to 99% by mass, and more preferably 5 to 80% by mass, in the total solid content of the composition.

Hereinafter, various polymers that may be used as the binder polymers in the present invention will be described.

Polymers Having Carbon-Carbon Unsaturated Bonds

As the binder polymer, a polymer having carbon-carbon unsaturated bonds in the molecule may be suitably used. The carbon-carbon unsaturated bonds may be present in either the main chain or the side chains, or may also be present in both of the chains. Hereinafter, the carbon-carbon unsaturated bond may also be simply referred to as an “unsaturated bond”, and a carbon-carbon unsaturated bond present at an end of the main chain or side chain may also be referred to as a “polymerizable group”.

In the case where the polymer has carbon-carbon unsaturated bonds in the main chain, the polymer may have the unsaturated bonds at one end, at both ends, or within the main chain. Furthermore, in the case where the polymer has carbon-carbon unsaturated bonds in the side chains, the unsaturated bonds may be directly attached to the main chain structure, or may also be attached to the main chain via an appropriate linking group.

Examples of the polymer containing carbon-carbon unsaturated bonds in the main chain include SB (polystyrene-polybutadiene), SBS (polystyrene-polybutadiene-polystyrene), SIS (polystyrene-polyisoprene-polystyrene), SEBS (polystyrene-polyethylene/polybutylene-polystyrene), and the like.

In the case of using a polymer having a highly reactive polymerizable unsaturated group such as a methacryloyl group, as the polymer having carbon-carbon unsaturated bonds in the side chain, a film having very high mechanical strength may be produced. Particularly, in polyurethane-based and polyester-based thermoplastic elastomers, highly reactive polymerizable unsaturated groups may be relatively simply introduced into the molecule.

When it is intended to introduce unsaturated bonds or polymerizable groups into the binder polymer, any known method may be employed, such as a method of copolymerizing the polymer with a structural unit having a polymerizable group precursor which is formed by attaching a protective group to the polymerizable group, and eliminating the protective group to restore the polymerizable group; or a method of producing a polymer compound having a plurality of reactive groups such as a hydroxyl group, an amino group, an epoxy group, a carboxyl group, an acid anhydride group, a ketone group, a hydrazine residue, an isocyanate group, an isothiacyanate group, a cyclic carbonate group or an ester group, subsequently reacting the polymer compound with a binding agent which has a plurality of groups capable of binding with the reactive group (for example, polyisocyanate and the like for the case of a hydroxyl group or an amino group), to thereby carry out adjustment of the molecular weight and conversion to a bindable group at the chain end, and then reacting this group which is capable of reacting with the terminal bindable group, with an organic compound having a polymerizable unsaturated group, to thus introduce a polymerizable group by means of a polymer reaction. When these methods are used, the amount of introduction of the unsaturated bond or the polymerizable group into the polymer compound may be controlled.

It is also preferable to use such a polymer having unsaturated bonds in combination with a polymer which does not have unsaturated bonds. That is, since a polymer obtainable by adding hydrogen to the olefin moiety of the polymer having carbon-carbon unsaturated bonds, or a polymer obtainable by forming a polymer using as a raw material a monomer in which an olefin moiety has been hydrogenated, such as a monomer resulting from hydrogenation of butadiene, isoprene or the like, has excellent compatibility, the polymer may be used in combination with the polymer having unsaturated bonds, so as to regulate the amount of unsaturated bonds possessed by the binder polymer. In the case of using these in combination, the polymer which does not have unsaturated bonds may be used in a proportion of generally 1 to 90 parts by mass, and preferably 5 to 80 parts by mass, relative to 100 parts by mass of the polymer having unsaturated bonds.

As will be discussed later, in aspects where curability is not required for the binder polymer, such as in the case of using another polymerizable compound in combination, unsaturated bonds are not necessarily essential to the binder polymer, and a variety of polymers which do not have unsaturated bonds may be solely used as the binder polymer. In such a case, examples of the polymer which does not have unsaturated bonds include polyesters, polyamides, polystyrene, acrylic resins, acetal resins, polycarbonates and the like.

The binder polymer suitable for the use in the present invention, which may or may not have unsaturated bonds, has a number average molecular weight preferably in the range of from 1000 to 1,000,000, and more preferably in the range of from 5000 to 500,000. When the number average molecular weight of the binder polymer is in the range of 1000 to 1,000,000, the mechanical strength of the film to be formed may be secured. Here, the number average molecular weight is a value measured using gel permeation chromatography (GPC), and reduced with respect to polystyrene standard products with known molecular weights.

Thermoplastic Polymer, and Polymer Having Decomposability

Examples of the binder polymer, which may be preferably used from the viewpoint of laser engraving sensitivity, includes a thermoplastic polymer which is liquefied by impartation of energy such as exposure or heating, and a polymer having a partial structure which is decomposed by impartation of energy (polymer having degradability).

Examples of the polymer having decomposability include those polymers containing, as a monomer unit having in the molecular chain a partial structure which is likely to be decomposed and cleaved, styrene, α-methylstyrene, α-methoxystyrene, acryl esters, methacryl esters, ester compounds other than those described above, ether compounds, nitro compounds, carbonate compounds, carbamoyl compounds, hemiacetal ester compounds, oxyethylene compounds, aliphatic cyclic compounds, and the like.

Among these, polyethers such as polyethylene glycol, polypropylene glycol and polytetraethylene glycol, aliphatic polycarbonates, aliphatic carbamates, polymethyl methacrylate, polystyrene, nitrocellulose, polyoxyethylene, polynorbornene, polycyclohexadiene hydrogenation products, or a polymer having a molecular structure having many branched structures such as dendrimers, may be particularly preferably exemplified in terms of decomposability.

Furthermore, a polymer containing a number of oxygen atoms in the molecular chain is preferable from the viewpoint of decomposability. From this point of view, compounds having a carbonate group, a carbamate group or a methacryl group in the polymer main chain, may be suitably exemplified. For example, a polyester or polyurethane synthesized from a (poly)carbonate diol or a (poly)carbonate dicarboxylic acid as the raw material, a polyamide synthesized from a (poly)carbonate diamine as the raw material, and the like may be exemplified as the examples of polymers having good thermal decomposability. These polymers may also be those containing a polymerizable unsaturated group in the main chain or the side chains. Particularly, in the case of a polymer having a reactive functional group such as a hydroxyl group, an amino group or a carboxyl group, it is also easy to introduce a polymerizable unsaturated group into such a thermally decomposable polymer.

The thermoplastic polymer may be an elastomer or a non-elastomer resin, and may be selected according to the purpose of the resin composition for laser engraving of the present invention.

Examples of the thermoplastic elastomer include urethane-based thermoplastic elastomers, ester-based thermoplastic elastomers, amide-based thermoplastic elastomers, silicone-based thermoplastic elastomers and the like. For the purpose of enhancing the laser engraving sensitivity of such a thermoplastic elastomer, an elastomer in which an easily decomposable functional group such as a carbamoyl group or a carbonate group has been introduced into the main chain, may also be used. A thermoplastic polymer may also be used as a mixture with the thermally decomposable polymer.

The thermoplastic elastomer is a material showing rubber elasticity at normal temperature, and the molecular structure includes a soft segment such as polyether or a rubber molecule, and a hard segment which prevents plastic deformation near normal temperature, as vulcanized rubber does. There exist various types of hard segments, such as frozen state, crystalline state, hydrogen bonding and ion bridging. Such thermoplastic elastomers may be suitable in the case of applying the resin composition for laser engraving of the present invention to the production of, for example, relief printing plates requiring plasticity, such as flexo plates.

The type of the thermoplastic elastomer is selected according to the purpose, and for example, in the case where solvent resistance is required, urethane-based, ester-based, amide-based and fluorine-based thermoplastic elastomers are preferred, while in the case where thermal resistance is required, urethane-based, olefin-based, ester-based and fluorine-based thermoplastic elastomers are preferred. Also, by selecting the type of the thermoplastic elastomer, hardness of the film formed from the resin composition may be greatly changed.

Examples of the non-elastomeric resin include polyester resins, unsaturated polyester resins, polyamide resins, polyamideimide resins, polyurethane resins, unsaturated polyurethane resins, polysulfone resins, polyethersulfone resins, polyimide resins, polycarbonate resins, all aromatic polyester resins, and hydrophilic polymers containing hydroxyethylene units (for example, polyvinyl alcohol derivatives).

Hydrophilic or Alcoholphilic Polymer

It is preferable that the binder polymer usable in the present invention be a hydrophilic or alcoholphilic polymer, from the viewpoint of the removability of remnants remaining after engraving. Specific examples of the hydrophilic polymer include those described below, but among them a hydrophilic polymer including a hydroxyethylene unit is preferred. Furthermore, as the hydrophilic or alcoholphilic binder, for example, polymers such as polyvinylbutyral may also be suitably used.

The hydrophilic polymer, which is one of suitable aspects of the binder polymer, will be described in detail. A hydrophilic polymer refers to a water-soluble or water-swellable polymer. Here, according to the present invention, the term "water-soluble" refers to a state in which the polymer dissolves in water at 25° C. in a proportion of 5% by mass or more, and the term "water-swellable" refers to a state in which when the polymer is added to water at 25° C. in a proportion up to 5% by mass, the polymer absorbs water and expands such that the polymer does not seem to be dissolved by eye observation, but there is no obvious solid state (powdered state) precipitate.

As for the hydrophilic polymer, a single polymer may be used, or plural species of polymers may also be used.

Examples of the hydrophilic polymer include hydrophilic polymers having a hydroxyethylene unit; polysaccharides having hydrophilic functional groups, including celluloses; acrylic resins having a salt structure with neutralized acidic functional groups, such as sodium polyacrylate, or a salt structure with neutralized amino groups, or an onium structure; polyamide resins or polyester resins having a hydrophilic group such as polyethylene oxide introduced into the molecule; gelatin; and the like.

Preferred examples of the hydrophilic polymer from the viewpoint of exhibiting good hydrophilicity, include hydrophilic polymers containing hydroxyethylene; celluloses containing a polar group such as an amino group, or a carboxylic acid group/sulfonic acid group/sulfuric acid group or a group having a salt structure obtained by neutralizing one of these groups; acrylic resins containing a polar group such as an amino group, or a carboxylic acid group/sulfonic acid group/sulfuric acid group or a group having a salt structure obtained by neutralizing one of these groups; and polyamide resins. More preferred examples include hydrophilic polymers containing hydroxyethylene; acrylic resins containing a polar group such as an amino group, or a carboxylic acid group/sulfonic acid group/sulfuric acid group or a group having a salt structure obtained by neutralizing one of these groups; and polyamide resins, while even more preferred examples include polyvinyl alcohols and polyamide resins.

A particularly preferred example of the hydrophilic polymer is a polymer selected from polyvinyl alcohol (PVA) and derivatives thereof, from the viewpoint of having film formability and having resistance to UV ink.

PVA and derivatives thereof as used in the present invention include copolymers or polymers containing a hydroxyethylene unit in a proportion of from 0.1 to 100% by mole, preferably 1 to 98% by mole, and more preferably 5 to 95% by mole, as well as modification products thereof.

The monomer for forming a copolymer with the vinyl alcohol structural unit may be appropriately selected from known copolymerizable monomers. Among the PVA and derivatives thereof, PVA and vinyl alcohol/vinyl acetate copolymers (partially saponified polyvinyl alcohol) may be mentioned as particularly preferred examples, and modification products thereof also correspond thereto.

As for the hydrophilic polymer, it is particularly preferable to use one or more selected from PVA and derivatives thereof, and a hydrophilic polymer which does not contain a hydroxyethylene unit (hereinafter, may also be appropriately referred to as "non-PVA derivative"), in combination.

The non-PVA derivative means that the polarity is close to the degree of showing compatibility with PVA and derivatives thereof. A specific example of the non-PVA derivative may be a hydrophilic polyamide obtained by introducing a hydrophilic group such as polyethylene glycol or piperazine, into a non-water-soluble polyamide obtainable by polymerization of adipic acid, 1,6-hexanediamine or ε-caprolactam only. The hydrophilic polyamide is suitable for the use as a non-PVA derivative because the hydrophilic polyamide manifests compatibility with a PVA derivative under the action of its hydrophilic group. That is, since such a hydrophilic polyamide has good compatibility with PVA and derivatives thereof, and easily infiltrates between the molecules of PVA and derivatives thereof, the intermolecular force between the two polymers is decreased, and the polymer as a whole is softened.

As the synthesis method for the hydrophilic polyamide, those shown below may be mentioned. When ε-caprolactam and/or adipic acid is reacted with a polyethylene glycol modified with amine at both chain ends, polyamide having a polyethylene glycol unit is obtained, while when ε-caprolactam and/or adipic acid is reacted with piperazine, a hydrophilic polyamide having a piperazine skeleton is obtained. Also, when the amide group of a hydrophilic polyamide is reacted with the epoxy group of glycidyl methacrylate, a hydrophilic polyamide having a crosslinkable functional group introduced into the polymer molecule is obtained. These non-PVA derivatives may be used individually alone, or may also be used as mixtures of a plurality of species.

Examples of the PVA derivatives include a polymer in which at least some of the hydroxyl groups of the hydroxyethylene unit have been modified into carboxyl groups; a polymer in which some of the same hydroxyl groups have been modified into (meth)acryloyl groups; a polymer in which at least some of the same hydroxyl groups have been modified into amino groups; a polymer in which ethylene glycol or propylene glycol, or an oligomer thereof has been introduced into at least some of the same hydroxyl groups; and the like.

The polymer in which at least some of the hydroxyl groups have been modified into carboxyl groups, may be obtained by esterifying polyvinyl alcohol or a partially saponified polyvinyl alcohol with a polyfunctional carboxylic acid such as, for example, succinic acid, maleic acid or adipic acid. The amount of introduction of carboxyl groups into the polymer is preferably 0.01 to 1.00 mole, and more preferably 0.05 to 0.80 moles, relative to 1 mole of the hydroxyl groups.

The polymer in which at least some of the hydroxyl groups have been modified into (meth)acryloyl groups, may be obtained by adding glycidyl(meth)acrylate to the above-mentioned carboxyl group-modified polymer, or by esterifying polyvinyl alcohol or a partially saponified polyvinyl alcohol with (meth)acrylic acid. The amount of introduction of (meth)acryloyl groups into the polymer is preferably 0.01 to 1.00 mole, and more preferably 0.03 to 0.50 moles, relative to 1 mole of the hydroxyl groups. Here, the expression "(meth) acryloyl group" is used to collectively refer to acryloyl group and/or methacryloyl group. Also, the expression "(meth) acrylate" is used to collectively refer to acrylate and/or methacrylate. The same applies to the expression "(meth)acrylic acid".

The polymer in which at least some of the hydroxyl groups have been modified into amino groups, may be obtained by esterifying polyvinyl alcohol or a partially saponified polyvinyl alcohol with a carboxylic acid containing an amino group such as, for example, carbamic acid. The amount of introduction of amino groups into the polymer is preferably 0.01 to 1.00 mole, more preferably 0.05 to 0.70 moles, relative to 1 mole of the hydroxyl groups.

The polymer in which ethylene glycol or propylene glycol, or an oligomer thereof has been introduced into at least some of the hydroxyl groups, may be obtained by heating polyvinyl alcohol or a partially saponified polyvinyl alcohol and a glycol in the presence of catalytic sulfuric acid, and removing water, which is a side product, out of the reaction system. The total amount of introduction of ethylene glycol or propylene glycol, or an oligomer thereof into the polymer is preferably 0.01 to 0.90 moles, and more preferably 0.03 to 0.50 moles, relative to 1 mole of the hydroxyl groups.

Among the modification products of PVA derivatives, the polymer in which at least some of hydroxyl groups have been modified into (meth)acryloyl groups is particularly preferably used. It is because, by directly introducing an unreacted crosslinkable functional group into the hydrophilic polymer, the strength of the relief forming layer may be enhanced, without using a large amount of a polyfunctional monomer as the ethylenic unsaturated monomer, which will be described later as a polymerizable compound, and therefore a balance can be achieved between the flexibility and strength of the relief forming layer.

The weight average molecular weight (measured by GPC and polystyrene-reduced) of the hydrophilic polymer used as the binder polymer is preferably 5,000 to 500,000. When the weight average molecular weight is 5000 or greater, the polymer has excellent shape retainability as an elemental resin, while when the weight average molecular weight is 500,000 or less, the polymer is easily dissolved in a solvent such as water, and is useful in preparing a resin composition for laser engraving. The weight average molecular weight of the hydrophilic polymer is more preferably 10,000 to 400,000, and particularly preferably 15,000 to 300,000.

In the case of using the hydrophilic polymer as the binder polymer, the content of the hydrophilic polymer is preferably 15 to 79% by mass, and more preferably 30 to 65% by mass, based on the total mass of the solid content of the resin composition for laser engraving. For example, in the case of applying the resin composition for laser engraving to the formation of the relief layer of a relief printing plate precursor, when the content of the hydrophilic polymer is set to 15% by mass or more, a print durability sufficient for using the resulting relief printing plate as the printing plate may be obtained. Also, when the content of the hydrophilic polymer is set to 79% by mass or less, there is no occurrence of the lack of other components, and even when the relief printing plate is used as a flexographic printing plate, a flexibility sufficient for using the relief printing plate as the printing plate may be obtained.

In the case of using PVA and/or a derivative thereof and a non-PVA derivative in combination as the hydrophilic polymer in the resin composition for laser engraving, the total content of these hydrophilic polymers is preferably 30 to 80% by mass, and more preferably 40 to 70% by mass, based on the total mass of the solid content of the resin composition. For example, in the case of applying the resin composition for laser engraving to the formation of the relief layer of a relief printing plate precursor, when the total content of the PVA derivative and non-PVA derivative is set to 30% by mass or more, cold flow of the printing plate precursor can be effectively prevented. When the total content is set to 80% by mass or less, there is no occurrence of the lack of other components, and a print durability sufficient for using the resulting relief printing plate as the printing plate may be obtained.

In the case of using PVA and/or a derivative thereof and a non-PVA derivative as the hydrophilic polymer in the resin composition for laser engraving, the content of the PVA derivative is preferably 15 to 79% by mass, and more preferably 30 to 65% by mass, based on the total mass of the solid content of the resin composition. For example, in the case of applying the resin composition for laser engraving to the formation of the relief layer of a relief printing plate precursor, when the content of the PVA derivative is set to 15% by mass or more, a print durability sufficient for using the resulting relief printing plate as the printing plate may be obtained. When the content of the PVA derivative is set to 79% by mass or less, there is no occurrence of the lack of other components, and even when the relief printing plate is used as a flexographic printing plate, a flexibility sufficient for using the relief printing plate as the printing plate may be obtained.

On the other hand, the content of the non-PVA derivative is preferably 1 to 15% by mass, and more preferably 3 to 10% by mass, based on the total mass of the solid content of the resin composition. For example, in the case of applying the resin composition for laser engraving to the formation of the relief layer of a relief printing plate precursor, when the content of the non-PVA derivative is set to 1% by mass or more, softening of the PVA derivative is efficiently achieved, and thus even when the relief printing plate is used as a flexographic printing plate, a flexibility sufficient for using the relief printing plate as the printing plate may be obtained. Also, due to the tough characteristic of the non-PVA derivative, a print durability sufficient for using the relief printing plate as the printing plate may be obtained. When the content of the non-PVA derivative is set to 15% by mass or less, the amount of generation of the tacky engraving remnants originating from the non-PVA derivative, may be reduced.

In the case of using PVA and/or a derivative as the binder polymer, the PVA and/or the derivative thereof may be used alone, or the PVA and/or the derivative thereof may also be used in combination with a non-PVA derivative. However, if the resin composition for laser engraving is to be applied to the production of a printing plate such as a flexographic printing plate, it is preferable to use the PVA and/or a derivative thereof in combination with a non-PVA derivative, from the viewpoint of securing the appropriate properties required by a flexographic printing plate, such as flexibility or abrasion resistance of the film. As for the mode of combined use, the PVA and/or a derivative thereof and the non-PVA derivative may be respectively individual, or any one of them may consist of a plurality of species, or even both of them may respectively consist of a plurality of species.

When a hydrophilic polymer is used, the engraving remnants also become hydrophilic, and consequently the engraving remnants can be removed by an operation that is convenient to the extent that the engraving remnants may be washed away with tap water after the engraving process. If a hydrophobic polymer such as SB (polystyrene-polybutadiene), SBS (polystyrene-polybutadiene-polystyrene), SIS (polystyrene-polyisoprene-polystyrene) or SEBS (polystyrene-polyethylene/polybutylene-polystyrene), or an elastomer, polyurethane or an acrylic resin is used as the main binder component, the engraving remnants are hydrophobic, and thus there may occur an instance where it is difficult to remove the engraving remnants by washing away with water. Furthermore, for example, when a PVA derivative is used as a hydrophilic polymer (particularly, one having a glass transition temperature higher than or equal to room temperature), the phenomenon of edge fusion of the relief at the time of engraving, which is caused by low glass transition temperature, tends to be suppressed as compared to the above-mentioned hydrophobic polymers or elastomers (mostly having a glass transition temperature lower than or equal to room temperature), and thus it is preferable.

The hydrophilic polymer may also be used in combination with a relatively hydrophobic binder polymer. As for the relatively hydrophobic binder polymer, polymers including the monomers shown below as a component of polymerization or copolymerization may be used, so as to adjust the properties such as the film hardness or flexibility at the time of film formation, and compatibility with other components such as co-present polymerizable compounds or initiator.

Compounds having only one ethylenic unsaturated bond, such as: (meth)acrylates having a hydroxyl group, such as 2-hydroxyethyl(meth)acrylate, 2-hydroxypropyl(meth)acrylate, 2-hydroxybutyl(meth)acrylate, 3-chloro-2-hydroxypropyl(meth)acrylate and β-hydroxy-β'-(meth)acryloyloxyethyl phthalate; alkyl(meth)acrylates such as methyl(meth)acrylate, ethyl(meth)acrylate, propyl(meth)acrylate, butyl(meth) acrylate, isoamyl(meth)acrylate, 2-ethylhexyl(meth)acrylate, lauryl(meth)acrylate and stearyl(meth)acrylate; cycloalkyl(meth)acrylates such as cyclohexyl(meth)acrylate; halogenated alkyl(meth)acrylates such as chloroethyl(meth) acrylate and chloropropyl(meth)acrylate; alkoxyalkyl(meth) acrylates such as methoxyethyl(meth)acrylate, ethoxyethyl (meth)acrylate and butoxyethyl(meth)acrylate; phenoxyalkyl(meth)acrylates such as phenoxyethyl acrylate and nonylphenoxyethyl(meth)acrylate; alkoxyalkylene glycol(meth)acrylate such as ethoxydiethylene glycol(meth) acrylate, methoxytriethylene glycol(meth)acrylate and methoxydipropylene glycol(meth)acrylate; (meth)acrylamides such as (meth)acrylamide, diacetone(meth)acrylamide, and N,N'-methylenebis(meth)acrylamide; 2,2-dimethylaminoethyl(meth)acrylate, 2,2-diethylaminoethyl(meth)acrylate, N,N-dimethylaminoethyl(meth)acrylamide and N,N-dimethylaminopropyl(meth)acrylamide; compounds having two or more ethylenic unsaturated bonds, such as: di(meth)acrylate of polyethylene glycol, such as diethylene glycol di(meth)acrylate; polypropylene glycol di(meth)acrylate such as dipropylene glycol di(meth)acrylate; trimethylolpropane tri(meth)acrylate, pentaerythritol tri(meth)acrylate, pentaerythritol tetra(meth)acrylate, glycerol tri(meth)acrylate; polyvalent(meth)acrylates obtainable by subjecting a compound having an ethylenic unsaturated bond and active hydrogen, such as an unsaturated carboxylic acid or unsaturated alcohol, to addition reaction to ethylene glycol diglycidyl ether; polyvalent(meth)acrylates obtainable by subjecting an unsaturated epoxy compound such as glycidyl(meth) acrylate, and a compound having active hydrogen, such as a carboxylic acid or an amine, to addition reaction; polyvalent (meth)acrylamides such as methylenebis(meth)acrylamide; polyvalent vinyl compounds such as divinylbenzene; and the like may be mentioned. According to the present invention, these may be used individually alone, or in combination of two or more species.

Preferred examples of the monomers of the above-mentioned polymerization components include, from the viewpoint of film formability, alkoxyalkylene glycol(meth)acrylates such as 2-hydroxyethyl(meth)acrylate, 2-hydroxypropyl(meth)acrylate, 2-hydroxybutyl(meth)acrylate, ethoxydiethylene glycol(meth)acrylate, methoxytriethylene glycol(meth)acrylate and methoxydipropylene glycol (meth)acrylate; (meth)acrylamide, diacetone(meth) acrylamide, cyclohexyl(meth)acrylate, benzyl(meth) acrylate, and N-acryloylmorpholine are preferred. Among these, acrylates are particularly preferred from the viewpoint of securing the flexibility of the obtainable polymers.

In addition to these, the following polymers may be mentioned as the polymer which may be used in combination as the binder polymer.

A polymer containing at least either an olefin or a carbon-carbon triple bond in the main chain may be mentioned, and examples thereof include SB (polystyrene-polybutadiene), SBS (polystyrene-polybutadiene-polystyrene), SIS (polystyrene-polyisoprene-polystyrene), SEBS (polystyrene-polyethylene/polybutylene-polystyrene), and the like.

A binder polymer which may be used in combination with the hydrophilic polymer is preferably contained to the extent of enhancing the film formability without decreasing the engraving sensitivity, and may be contained in a proportion of preferably 1 to 50% by mass, more preferably 1 to 30% by mass, and most preferably 1 to 10% by mass, of the total amount of the binder polymer.

According to the present invention, the combination of an acetylene compound and a hydrophilic polymer, particularly the combination of an acetylene compound and PVA and a derivative thereof, is presumed to be highly sensitive, although it is merely a presumption after all, because a PVA derivative has a large number of highly polar hydroxyl groups, and therefore the hydroxyl groups are very compatible with acetylene sites where the electron density is high. As a result, it is conceived that since heat transfer to the PVA derivative, which is the main component undergoing thermal decomposition at the time of laser engraving and removed, is made highly efficient, such high sensitivity is resulted.

It is preferable that the resin composition for laser engraving of the present invention contains optional components such as a polymerizable compound, a photothermal conversion agent, a polymerization initiator and a plasticizer, together with the acetylene compound and the binder polymer previously mentioned as essential components. Hereinafter, these components will be respectively described in detail.

(C) Polymerizable Compound

The polymerizable compound as used in the present invention means a compound having at least one or more carbon-carbon unsaturated bonds which may be radical polymerized, with the generation of initiating radicals derived from a polymerization initiator serving as the trigger. Hereinafter, more detailed description will be given, with reference to an exemplary case of using an addition polymerizable compound as the polymerizable compound.

As a preferred polymerizable compound that can be used in the present invention, an addition polymerizable compound having at least one ethylenic unsaturated double bond may be mentioned. This addition polymerizable compound is preferably selected from compounds having at least one, preferably two or more, terminal ethylenic unsaturated bonds. The family of such compounds is widely known in the pertinent industrial field, and these compounds may be used in the present invention without any particular limits. These compounds have chemical forms such as, for example, a monomer, a prepolymer, namely, a dimer, a trimer and an oligomer, or a copolymer thereof, and a mixture of those. Examples of the monomer include unsaturated carboxylic acids (for example, acrylic acid, methacrylic acid, itaconic acid, crotonic acid, isocrotonic acid, maleic acid, and the like), or esters thereof, and amides. Preferably, esters of an unsaturated carboxylic acid and an aliphatic polyhydric alcohol compound, and amides of an unsaturated carboxylic acid and an aliphatic polyvalent amine compound are used. Furthermore, unsaturated carboxylic acid esters having a nucleophilic substituent such as a hydroxyl group, an amino group or a mercapto group; adducts of an amide with a monofunctional or polyfunctional isocyanate or an epoxy compound; dehydration condensation reaction products of an amide with a monofunctional or polyfunctional carboxylic acid, and the like may also be suitably used. Unsaturated carboxylic acid esters having an electrophilic substituent such as an isocyanate group or an epoxy group; adducts of an amide with a monofunctional or polyfunctional alcohol, an amine or a thiol; unsaturated carboxylic acid esters having a detachable substituent such as a halogen group or a tosyloxy group; substitution reaction products of an amide with a monofunctional or polyfunctional alcohol, an amine or a thiol, are also suitable. As another example, a family of compounds in which unsaturated phosphonic acid, styrene, vinyl ether or the like is used instead of the unsaturated carboxylic acid may also be used.

Specific examples of the ester monomer of an aliphatic polyhydric alcohol compound and an unsaturated carboxylic acid include, as acrylic acid esters, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethyelne glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomers, and the like.

Other examples of the ester monomer include, as methacrylic acid esters, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis[p-(methacryloxyethoxy)phenyl]dimethylmethane, and the like.

Examples of the ester monomer as itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, and the like.

Examples of the ester monomer as crotonic acid esters include ethylene glycol dicrotonate, tetramethylene glycol dicrotonate, pentaerythritol dicrotonate, sorbitol tetracrotonate, and the like.

Examples of the ester monomer as isocrotonic acid esters include ethylene glycol diisocrotonate, pentaerythritol diisocrotonate, sorbitol tetraisocrotonate, and the like.

Examples of the ester monomer as maleic acid esters include ethylene glycol dimaleate, triethylene glycol dimaleate, pentaerythritol dimaleate, sorbitol tetramaleate, and the like.

As other examples of the ester, for example, the aliphatic alcohol-based esters as described in Japanese Patent Application Publication (JP-B) Nos. 46-27926 and 51-47334, and JP-A No. 57-196231; the esters having an aromatic skeleton as described in JP-A Nos. 59-5240, 59-5241 and 2-226149; the esters containing an amino group as described in JP-A No. 1-165613; and the like may also be suitably used.

The above-described ester monomers may also be used as mixtures.

Specific examples of the amide monomer of an aliphatic polyvalent amine compound and an unsaturated carboxylic acid include methylenebisacrylamide, methylenebismethacrylamide, 1,6-hexamethylenebisacrylamide, 1,6-hexamethylenebismethacrylamide, diethylenetriamine trisacrylamide, xylenebisacrylamide, xylenebismethacrylamide, and the like.

Other preferred examples of the amide-based monomer include the amides having a cyclohexylene structure as described in JP-B No. 54-21726.

Furthermore, urethane-based addition polymerizable compounds that are produced using an addition reaction of an isocyanate and a hydroxyl group, are also suitable, and specific examples thereof include, for example, the vinylurethane compound containing two or more polymerizable vinyl groups in one molecule as described in JP-B No. 48-41708, which is obtained by adding a vinyl monomer containing a hydroxyl group represented by following formula (A), to a polyisocyanate compound having two or more isocyanate groups in one molecule, and the like:

$$CH_2{=}C(R)COOCH_2CH(R')OH \quad (A)$$

wherein R and R' each represent H or $CH_3$.

The urethane acrylates described in JP-A No. 51-37193, JP-B Nos. 2-32293 and 2-16765; and the urethane compounds having an ethylene oxide skeleton as described in JP-B Nos. 58-49860, 56-17654, 62-39417 and 62-39418 are also suitable.

Furthermore, when the addition polymerizable compounds having an amino structure or a sulfide structure in the molecule as described in JP-A Nos. 63-277653, 63-260909 and 1-105238, are used, a curable composition may be obtained in a short time.

As still other examples, there may be mentioned polyester acrylates such as those described in JP-A No. 48-64183, and JP-B Nos. 49-43191 and 52-30490; and polyfunctional acrylates or methacrylates such as epoxy acrylates obtained by reacting an epoxy resin and (meth)acrylic acid. There may also be mentioned the specific unsaturated compounds described in JP-B Nos. 46-43946, 1-40337 and 1-40336; the vinylphosphonic acid compounds described in JP-A No. 2-25493; and the like. In certain cases, the structure containing a perfluoroalkyl group as described in JP-A No. 61-22048 is suitably used. The compounds introduced in Journal of the Adhesion Society of Japan, Vol. 20, No. 7, 300-308 (1984) as photocurable monomers and oligomers, may also be used.

From the viewpoint of photosensitization speed, a structure having a high content of unsaturated groups per molecule is preferred, and in many cases, a bi- or higher functional structure is preferred. In order to enhance the strength of the image parts, that is, of the cured film, a tri- or higher functional structure is favorable, and a method of controlling both photosensitivity and strength by using compounds having different functionalities and different polymerizable groups (for example, acrylic acid esters, methacrylic acid esters, styrene-based compounds, or vinyl ether-based compounds) in combination, is also effective. The addition polymerizable compounds are used in a proportion in the range of preferably 10 to 60% by mass, and more preferably 15 to 40% by mass, based on the non-volatile components in the composition. These compounds may be used individually alone, or may also be used in combination of two or more species. By using polymerizable compounds, the film properties such as, for example, brittleness and flexibility may also be adjusted.

Before and/or after laser degradation, the resin composition for laser engraving containing a polymerizable compound may be polymerized and cured by means of energy in the form of light, heat or the like.

Specific preferred examples of the polymerizable compound which can be used in the resin composition for laser engraving of the present invention, will be listed in the following, but the examples are not limited to these.

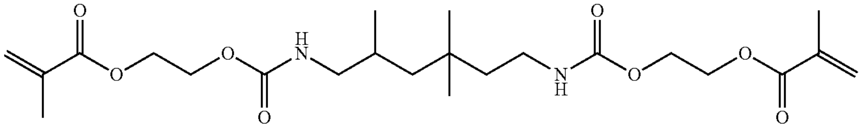

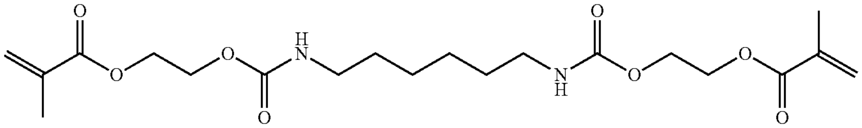

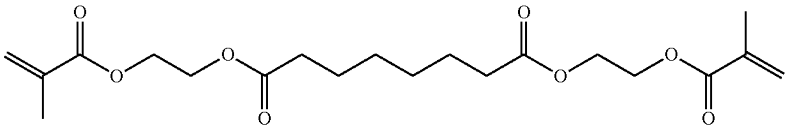

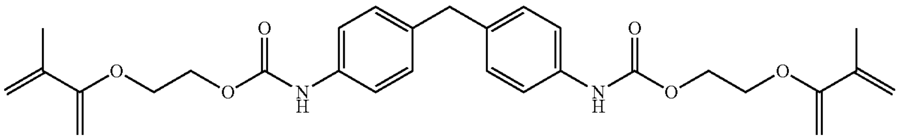

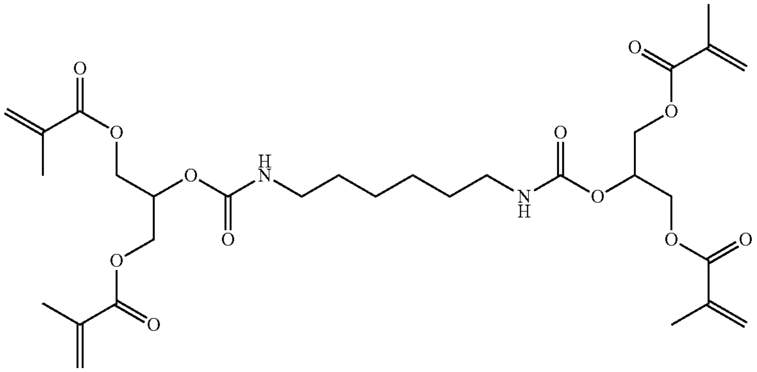

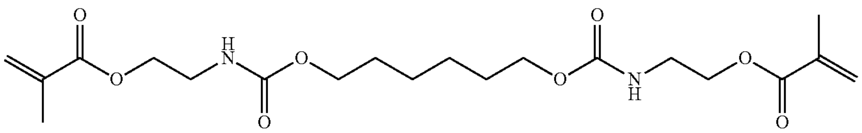

-continued

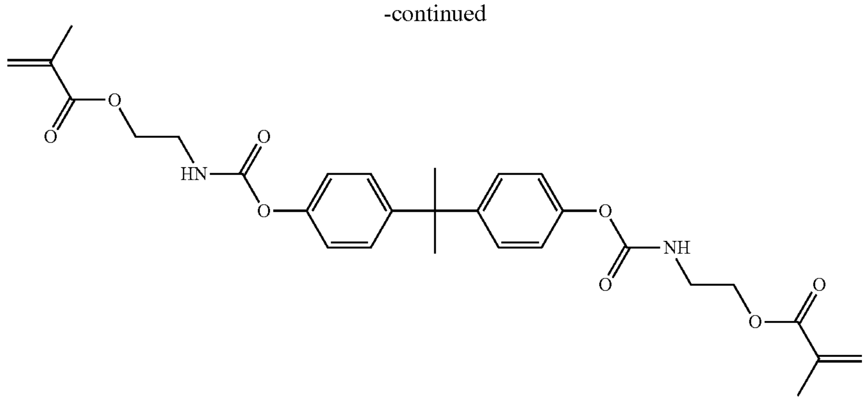

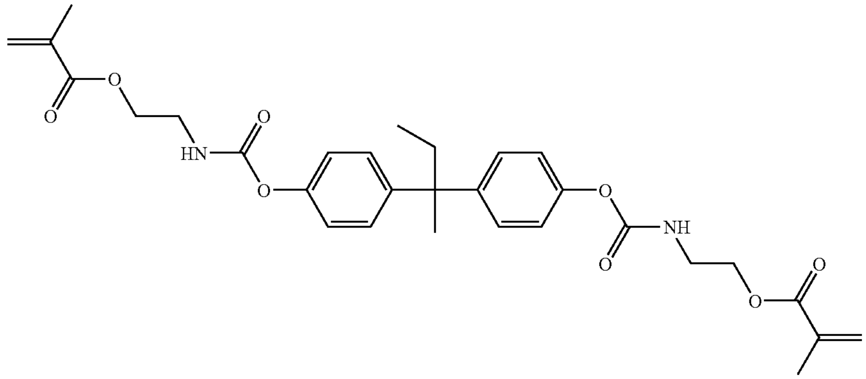

In the case of applying the resin composition for laser engraving of the present invention to the relief forming layer of a relief printing plate precursor, among the polymerizable compounds, those compounds containing a sulfur (S) atom are particularly preferred, from the viewpoint that edge fusion of the relief hardly occurs, and sharp relief is easily obtained. That is, compounds containing S atoms in the crosslinked network are preferred.

A polymerizable compound which contains an S atom and a polymerizable compound which does not contain an S atom may also be used in combination, but from the viewpoint that edge fusion of the relief hardly occurs, it is preferable to use the polymerizable compound containing an S atom alone. Furthermore, when a plurality of S-containing polymerizable compounds having different characteristics are used in combination, such combined use may contribute to the control of the film flexibility, or the like.

Examples of the polymerizable compound containing an S atom include the following compounds.

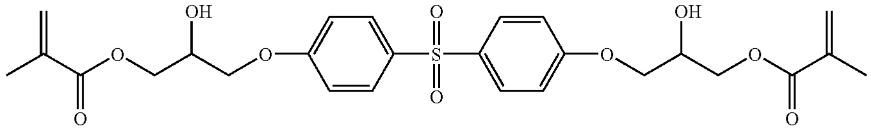

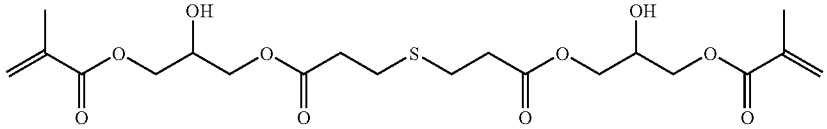

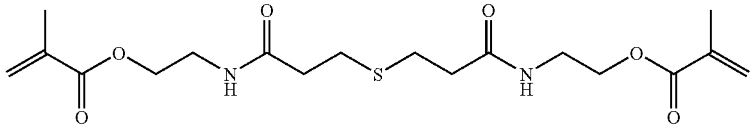

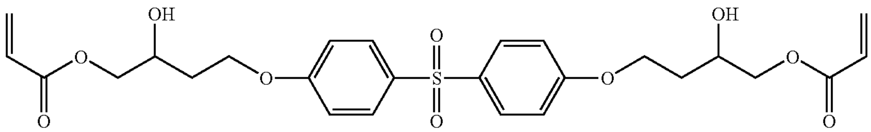

-continued
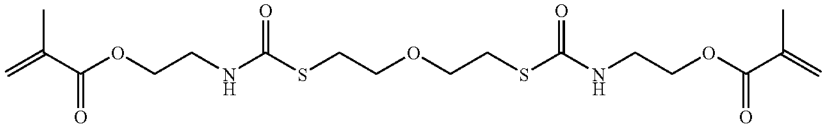
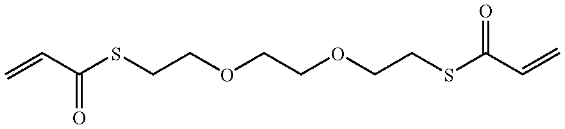
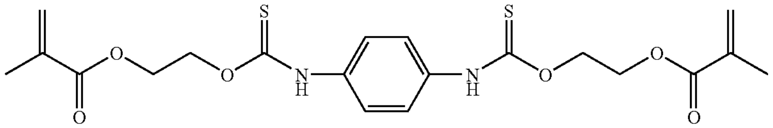
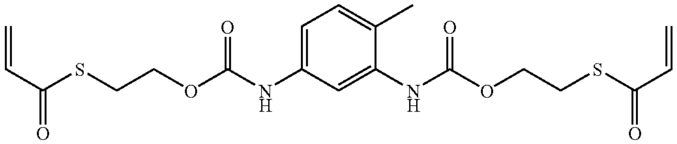
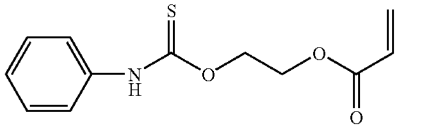
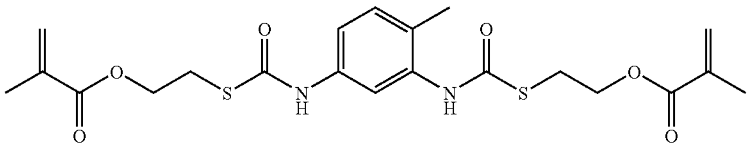
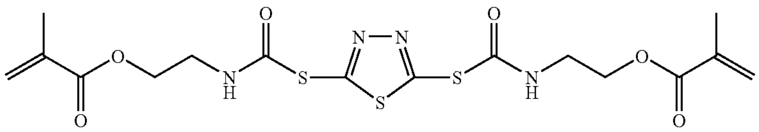
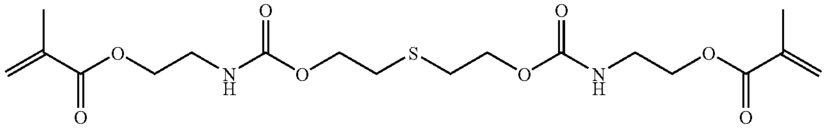
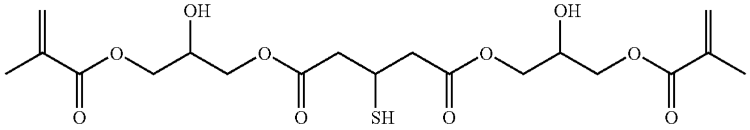
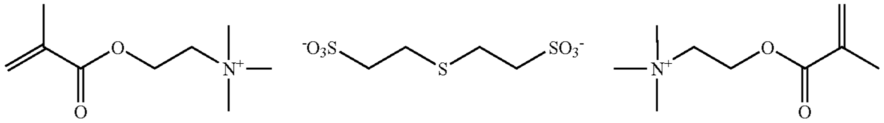
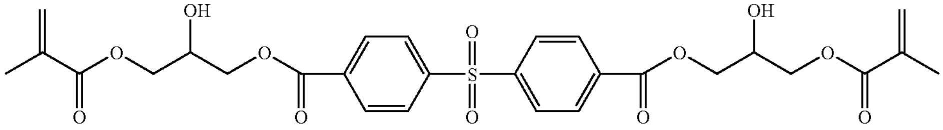
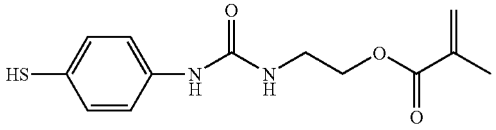
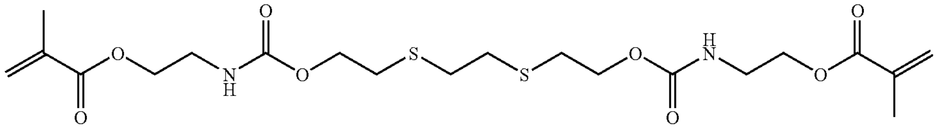

-continued

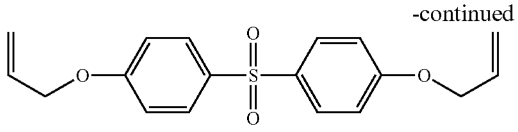

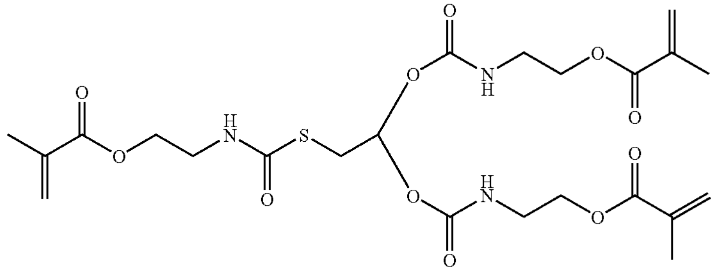

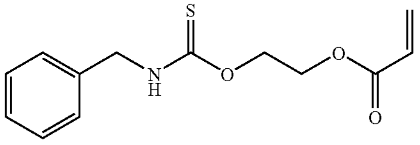

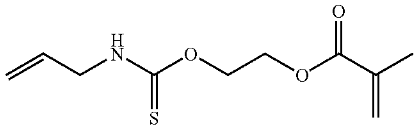

(D) Photothermal Conversion Agent

The resin composition for laser engraving of the present invention preferably contains a photothermal conversion agent which is capable of absorbing light in the wavelength range of 700 to 1300 nm. That is, the photothermal conversion agent according to the present invention is a compound having a wavelength of maximum absorption in the range of 700 to 1300 nm.

When the resin composition for laser engraving of the present invention is used in a laser engraving process in which a laser emitting infrared radiation in the wavelength range of 700 to 1300 nm (YAG laser, semiconductor laser, fiber laser, surface emitting laser, or the like) is used as a light source, the photothermal conversion agent is used as an infrared absorbent. The photothermal conversion agent absorbs laser light, and generates heat to thereby accelerate thermal decomposition of the resin composition. The photothermal conversion agent usable in the present invention is preferably a dye or a pigment having the maximum absorption in a wavelength range of 700 nm to 1300 nm.

As for the dye, commercially available dyes, and known dyes that are described in literatures such as "Handbook of Dyes" (edited by the Society of Synthetic Organic Chemistry, Japan, 1970), may be used. Specific examples thereof include dyes such as azo dyes, metal complex azo dyes, pyrazolone azo dyes, naphthoquinone dyes, anthraquinone dyes, phthalocyanine dyes, carbonium dyes, diimmonium compounds, quinonimine dyes, methine dyes, cyanine dyes, squarylium colorants, pyrylium salts, and metal thiolate complexes.

Preferred examples of the dye include the cyanine dyes described in JP-A Nos. 58-125246, 59-84356, 59-202829, 60-78787 and the like; the methine dyes described in JP-A Nos. 58-173696, 58-181690, 58-194595, and the like; the naphthoquinone dyes described in JP-A Nos. 58-112793, 58-224793, 59-48187, 59-73996, 60-52940, 60-63744 and the like; the squarylium colorants described in JP-A No. 58-112792 and the like; the cyanine dyes described in U.K. Patent No. 434,875; and the like.

Furthermore, the near-infrared absorption sensitizers described in U.S. Pat. No. 5,156,938 may also be used preferably, and the substituted arylbenzo(thio)pyrylium salts described in U.S. Pat. No. 3,881,924; the trimethinethiapyrylium salts described in JP-A No. 57-142645 (U.S. Pat. No. 4,327,169); the pyrylium-based compounds described in JP-A Nos. 58-181051, 58-220143, 59-41363, 59-84248, 59-84249, 59-146063 and 59-146061; the cyanine dyes described in JP-A No. 59-216146; the pentamethinethiopyrylium salts and the like described in U.S. Pat. No. 4,283,475; and the pyrylium compounds described in JP-B Nos. 5-13514 and 5-19702 are also preferably used. Another preferred example of the dye is the near-infrared absorption dyes represented by formulae (I) and (II) in the specification of U.S. Pat. No. 4,756,993.

Another preferred example of the photothermal conversion agent of the present invention is the specific indolenine cyanine colorants described in JP-A No. 2002-278057.

Particularly preferred examples among these dyes include cyanine colorants, squarylium colorants, pyrylium salts, nickel thiolate complexes, and indolenine cyanine colorants. Cyanine colorants or indolenine cyanine colorants are even more preferred.

Specific examples of the cyanine colorants which may be suitably used in the present invention include those described in paragraphs [0017] to [0019] of JP-A No. 2001-133969, paragraphs [0012] to [0038] of JP-A No. 2002-40638, and paragraphs [0012] to [0023] of JP-A No. 2002-23360.

The colorants represented by following formula (d) or (e) are preferred from the viewpoint of photothermal conversion property.

(d)

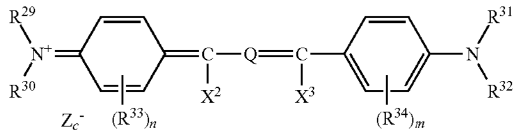

In formula (d), $R^{29}$ to $R^{31}$ each independently represent a hydrogen atom, an alkyl group or an aryl group; $R^{33}$ and $R^{34}$ each independently represent an alkyl group, a substituted oxy group, or a halogen atom; n and m each independently represent an integer from 0 to 4; $R^{29}$ and $R^{30}$ or $R^{31}$ an $R^{32}$ may be respectively be bound to each other to form a ring, and $R^{29}$ and/or $R^{30}$ may be bound to $R^{33}$, and $R^{31}$ and/or $R^{32}$ may be bound to $R^{34}$, to respectively form a ring; if a plurality of $R^{33}$ or $R^{34}$ are present, $R^{33}$'s or $R^{34}$'s may be bound to each other to form a ring; $X^2$ and $X^3$ each independently represent a hydrogen atom, an alkyl group or an aryl group, and at least one of $X^2$ and $X^3$ represents a hydrogen atom or an alkyl group; Q represents a trimethine group or pentamethine group which may be substituted, and may form a cyclic structure together with a divalent organic group; and $Zc^-$ represents a counter-anion. However, if the colorant represented by formula (d) has an anionic substituent in the structure and does not require charge neutralization, $Za^-$ is not necessary. Preferably, $Za^-$ is a halogen ion, a perchloric acid ion, a tetrafluoroborate ion, a hexafluorophosphate ion or a sulfonic acid ion, from the viewpoint of the storage stability of the photosensitive layer coating solution, and particularly preferably, $Za^-$ is a perchloric acid ion, a hexafluorophosphate ion or an arylsulfonic acid ion.

Specific examples of the dyes represented by formula (d), which may be suitably used in the present invention, include those shown below.

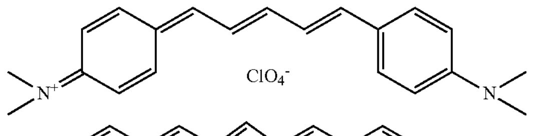

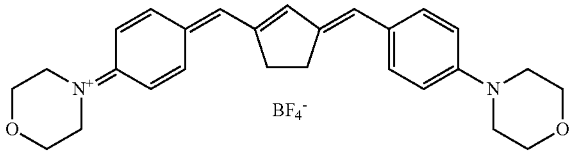

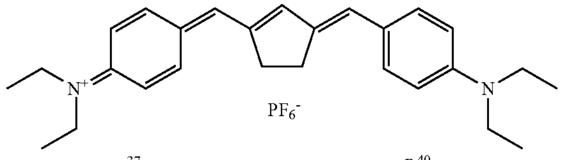

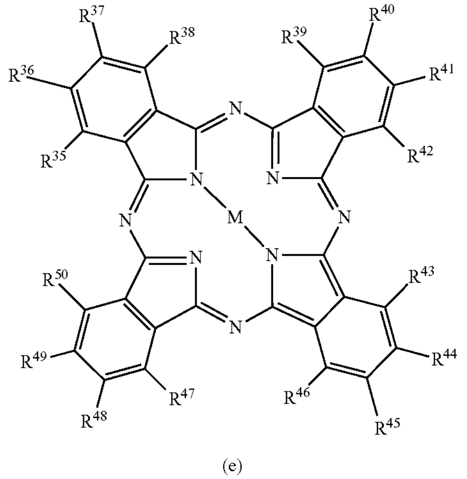

(e)

In formula (e), $R^{35}$ to $R^{50}$ each independently represent a hydrogen atom, a halogen atom, a cyano group, an alkyl group, an aryl group, an alkenyl group, an alkynyl group, a hydroxyl group, a carbonyl group, a thio group, a sulfonyl group, a sulfinyl group, an oxy group, an amino group, or an onium salt structure, and if it is possible to introduce substituents to these groups, the groups may be substituted; M represents two hydrogen atoms or metal atoms, a halo-metal group, or an oxy-metal group, and as the metal atoms included therein, there may be mentioned the atoms of Groups IA, IIA, IIIB and IVB of the Period Table of Elements, the first-row, second-row and third-row transition metals, and lanthanoid elements. Among them, copper, magnesium, iron, zinc, cobalt, aluminum, titanium and vanadium are preferred.

Specific examples of the dyes represented by formula (e), which may be suitably used in the present invention, include those shown below.

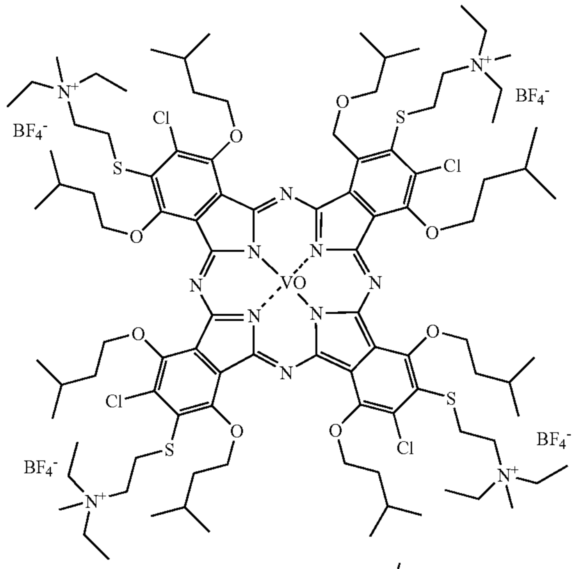

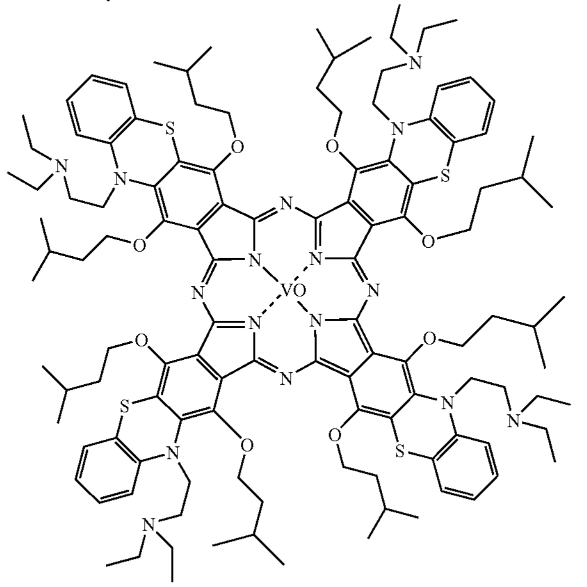

As the pigments which may be used in the present invention, commercially available pigments, and the pigments described in the Color Index (C.I.) Handbook, "Handbook of New Pigments" (edited by Japan Association of Pigment Technology, 1977), "New Pigment Application Technology" (published by CMC, Inc., 1986), and "Printing Ink Technology" (published by CMC, 1984), may be used.

Exemplary types of the pigments include Black pigments, Yellow pigments, Orange pigments, Brown pigments, Red pigments, Magenta pigments, Blue pigments, Green pigments, fluorescent pigments, metal powder pigments, and other polymer-bound pigments. Specifically, insoluble azo pigments, azo lake pigments, condensed azo pigments, chelate azo pigments, phthalocyanine-based pigments, anthraquinone-based pigments, perylene- and perinone-based pigments, thio indigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments, carbon black, and the like may be used. Among these pigments, preferred is carbon black.

These pigments may be used without providing any surface treatment, or may be used after providing surface treatments. Exemplary methods of surface treatment include a method of coating the pigment surface with resin or wax, a method of adhering surfactants to the pigment surface, a method of binding a reactive substance (for example, a silane coupling agent, an epoxy compound, polyisocyanate, or the like) to the pigment surface, and the like. These surface treatment methods are described in "Properties and Applications of Metal Soaps" (published by Saiwai Shobo Co., Ltd.), "Printing Ink Technology" (published by CMC, Inc., 1984), and "New Pigment Application Technology" (published by CMC, Inc., 1986).

The particle size of the pigment is preferably in the range of 0.01 μm to 10 μm, more preferably in the range of 0.05 μm to 1 μm, and particularly preferably in the range of 0.1 μm to 1 μm. When the particle size of the pigment is 0.01 μm or larger, the dispersion stability of the pigment in the coating solution is increased. Also, when the particle size is 10 μm or less, the uniformity of the layer formed from the resin composition becomes good.

As for the method for dispersing the pigment, known dispersion technologies that are used in the production of ink or in the production of toner may be used. As the dispersing instrument, there may be mentioned an ultrasonic dispersing machine, a sand mill, an attritor, a pearl mill, a super mill, a ball mill, an impeller, a disperser, a KD mill, a colloid mill, Dynatron, a triple-roll mill, a pressurized kneader, and the like. Details are described in "New Pigment Application Technology" (published by CMC, Inc., 1986).

One of suitable aspects of the photothermal conversion agent according to the present invention is at least one compound selected from cyanine-based compounds and phthalocyanine-based compounds, from the viewpoint of high engraving sensitivity. Furthermore, when these photothermal conversion agents are used in a combination (condition) such that the thermal decomposition temperature of the photothermal conversion agent is equal to or higher than the thermal decomposition temperature of a hydrophilic polymer which is suitable as the binder polymer, the engraving sensitivity tends to be further increased, which is preferable.

As specific examples of the photothermal conversion agent that may be used in the present invention, there may be mentioned, among cyanine-based colorants such as heptamethine cyanine colorants, oxonol-based colorants such as pentamethine oxonol colorants, indolium-based colorants, benzindolium-based colorants, benzothiazolium-based colorants, quinolinium-based colorants, phthalide compounds reacted with a color developing agent, and the like, those having their wavelength of maximum absorption in the range of 700 to 1300 nm. The photo-absorption properties vary greatly depending on the type and the intramolecular position of the substituent, the number of conjugate bonds, the type of counterion, the surrounding environment around the colorant molecule, or the like.

Commercially available laser colorants, hypersaturated absorption colorants, and near-infrared absorption colorants may also be used. For example, as the laser colorants, trade names "ADS740PP", "ADS745HT", "ADS760MP", "ADS740WS", "ADS765WS", "ADS745HO", "ADS790NH" and "ADS800NH" manufactured by American Dye Source, Inc. (Canada); and trade names "NK-3555", "NK-3509" and "NK-3519" manufactured by Hayashibara Biochemical Labs, Inc., may be mentioned. As the near-infrared absorption colorants, trade names "ADS775MI", "ADS775MP", "ADS775HI", "ADS 775PI", "ADS775PP", "ADS780MT", "ADS780BP", "ADS793EI", "ADS798MI", "ADS798MP", "ADS800AT", "ADS805PI", "ADS805PP", "ADS805PA", "ADS805PF", "ADS812MI", "ADS815EI", "ADS818HI", "ADS818HT", "ADS822MT", "ADS830AT", "ADS838MT", "ADS840MT", "ADS845BI", "ADS905AM", "ADS956BI", "ADS1040T", "ADS1040P", "ADS1045P", "ADS1050P", "ADS1060A", "ADS1065A", "ADS1065P", "ADS1100T", "ADS1120F", "ADS1120P", "ADS780WS", "ADS785WS", "ADS790WS", "ADS805WS", "ADS820WS", "ADS830WS", "ADS850WS", "ADS780HO", "ADS810CO", "ADS820HO", "ADS821NH", "ADS840NH", "ADS880MC", "ADS890MC" and "ADS920MC" manufactured by American Dye Source, Inc. (Canada); trade names "YKR-2200", "YKR-2081", "YKR-2900", "YKR-2100" and "YKR-3071" manufactured by Yamamoto Chemical Industry Co., Ltd.; trade name "SDO-1000B" manufactured by Arimoto Chemical Co., Ltd.; trade names "NK-3508" and "NKX-114" manufactured by Hayashibara Biochemical Labs, Inc., may be mentioned. However, the examples are not intended to be limited to these only.

As for the phthalide compound reacted with a color developing agent, those described in Japanese Patent No. 3271226 may be used. Phosphoric acid ester metal compounds, for example, the complexes of a phosphoric acid ester and a copper salt described in JP-A No. 6-345820 and WO 99/10354, may also be used. Furthermore, ultramicroparticles having light absorption characteristics in the near-infrared region, and having a number average particle size of preferably 0.3 μm or less, more preferably 0.1 μm or less, and even more preferably 0.08 μm or less, may also be used. For example, metal oxides such as yttrium oxide, tin oxide and/or indium oxide, copper oxide and iron oxide; or metals such as gold, silver, palladium and platinum may also be mentioned. Also, compounds obtained by adding metal ions such as the ions of copper, tin, indium, yttrium, chromium, cobalt, titanium, nickel, vanadium and rare earth elements, into microparticles made of glass or the like, which have a number average particle size of 5 μm or less, and more preferably 1 μm or less, may also be used. In the case of a colorant which is likely to react with a photosensitive resin composition and have a changed wavelength of light absorption, the colorant may be encapsulated in microcapsules. In that case, the number average particle size of the capsules is preferably 10 μm or less, more preferably 5 μm or less, and even more preferably 1 mm or less. Compounds obtained by adsorbing metal ions of copper, tin, indium, yttrium, rare earth elements or the like on ion-exchanged microparticles, may also be used. The ion-exchanged microparticles may be any of organic resin microparticles or inorganic microparticles. Examples of the inorganic microparticles include amorphous zirconium phosphate, amorphous zirconium phosphosilicate, amorphous zirconium hexametaphosphate, lamellar zirconium phosphate, reticulated zirconium phosphate, zirconium tungstate, zeolites and the like. Examples of the organic resin microparticles include generally used ion-exchange resins, ion-exchange celluloses, and the like.

Another suitable aspect of the photothermal conversion agent according to the present invention is carbon black.

As for the carbon black, any type may be used, irrespective of the classification according to ASTM as well as the application (for example, uses in coloration, rubber making, batteries, and the like), as long as the carbon black has stable dispersibility or the like in the composition. Examples of the carbon black include furnace black, thermal black, channel black, lamp black, acetylene black, and the like. In addition, black-colored colorants such as carbon black may be used in the form of color chips or color pastes, in which the colorants have been dispersed in advance in nitrocellulose, a binder or the like using a dispersant if necessary, so as to facilitate dispersion. Such chips or pastes can be easily obtained as commercially available products.

According to the present invention, a carbon black having a relatively low specific surface area and a relatively low DBP absorption, as well as a micronized carbon black having a large specific surface area may also be used. Suitable examples of the carbon black include PRINTEX (registered trademark), PRINTEX U (registered trademark) A or SPEZIALSCHWARZ (registered trademark) 4 (manufactured by Degussa GmbH).

As for the carbon black which is applicable to the present invention, a conductive carbon black having a specific surface area of at least 150 $m^2/g$ and a DBP number of at least 150 ml/100 g is preferred, from the viewpoint that the engraving sensitivity is improved as the carbon black efficiently transfers the heat generated by photothermal conversion to the polymer in the surroundings.

This specific surface area is preferably at least 250 $m^2/g$, and particularly preferably at least 500 $m^2/g$. The DBP number is preferably at least 200, and particularly preferably at least 250 ml/100 g. The above-mentioned carbon black may be an acidic carbon black, or may also be a basic carbon black. The carbon black (a2) is preferably a basic carbon black. A mixture of different binders may also be definitely used.

Appropriate conductive carbon blacks having a specific surface area up to about 1500 $m^2/g$ and a DBP number up to about 550 ml/100 g, are commercially available, for example, under the name of KETJENNLACK (registered trademark) EC300J and KETJENNLACK (registered trademark) EC600J (manufactured by Akzo Nobel BV); PRINTEX (registered trademark) XE (manufactured by Degussa GmbH); BLACK PEARLS (registered trademark) 2000 (manufactured by Cabot Corporation); or KETJENBLACK (manufactured by Lion Corporation).

The content of the photothermal conversion agent in the resin composition for laser engraving may vary largely depending on the magnitude of the molecular absorption coefficient intrinsic to the molecule, but the content is preferably in the range of 0.01 to 20% by mass, more preferably in the range of 0.05 to 10% by mass, and particularly preferably in the range of 0.1 to 5% by mass, of the total mass of the solid content of the resin composition.

(E) Polymerization Initiator

The resin composition for laser engraving of the present invention preferably contains a polymerization initiator.

In regard to the polymerization initiator, compounds that are known to those having ordinary skill in the art may be used without limitation. Specific examples thereof are extensively described in Bruce M. Monroe, et al., Chemical Revue, 93 435 (1993) or R. S. Davidson, Journal of Photochemistry and Biology A: Chemistry, 73, 81 (1993); J. P. Faussier, "Photoinitiated Polymerization—Theory and Applications": Rapra Review Vol. 9, Report, Rapra Technology (1998); M. Tsunooka et al., Prog. Polym. Sci., 21, 1 (1996); and the like. Also known is a family of compounds which oxidatively or reductively cause bond cleavage, such as those described in F. D. Saeva, Topics in Current Chemistry, 156, 59 (1990); G. G. Maslak, Topics in Current Chemistry, 168, 1 (1993); H. B. Shuster et al., JACS, 112, 6329 (1990); I. D. F. Eaton et al., JACS, 102, 3298 (1980); and the like.

Hereinafter, specific examples of preferred polymerization initiators will be discussed in detail, particularly in regard to radical polymerization initiators which are compounds capable of generating radicals by the action of photo and/or thermal energy, and initiating and accelerating a polymerization reaction with a polymerizable compound. However, the present invention is not intended to be restricted by the discussion.

According to the present invention, preferred examples of radical polymerization initiators include (a) aromatic ketones, (b) onium salt compounds, (c) organic peroxides, (d) thio compounds, (e) hexaarylbiimidazole compounds, (f) keto oxime ester compounds, (g) borate compounds, (h) azinium compounds, (i) metallocene compounds, (j) active ester compounds, (k) compounds having a carbon-halogen bond, (l) azo compounds, and the like. Specific examples of the compounds of (a) to (l) will be mentioned, but the present invention is not intended to be limited to these.

(a) Aromatic Ketones (a) Aromatic ketones which are preferable as the radical polymerization initiator usable in the present invention, may include the compounds having a benzophenone skeleton or a thioxanthone skeleton as described in "RADIATION CURING IN POLYMER SCIENCE AND TECHNOLOGY", J. P. Fouassier and J. F. Rabek (1993), p. 77-117. For example, the following compounds may be mentioned.

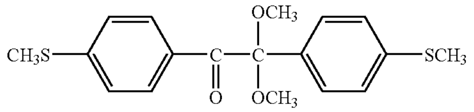

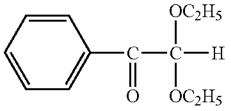

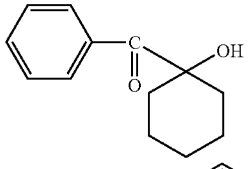

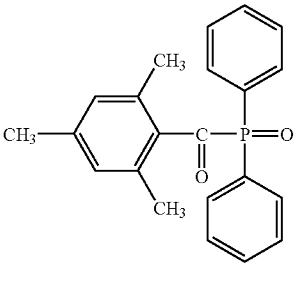

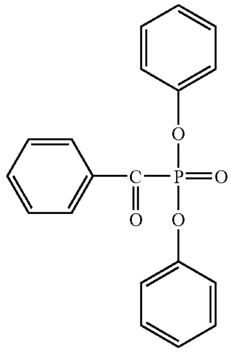

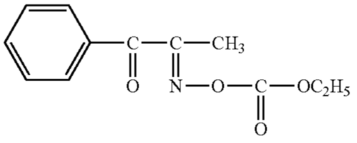

-continued

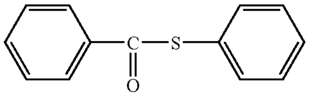

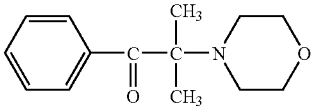

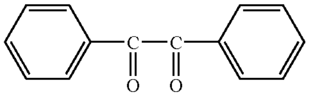

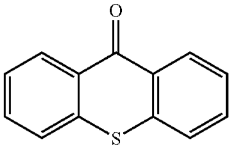

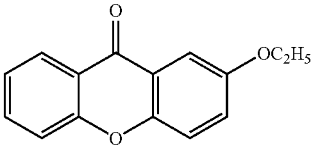

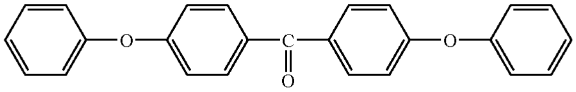

Among them, particularly preferred examples of the (a) aromatic ketones include, for example, the following compounds.

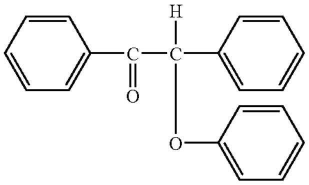

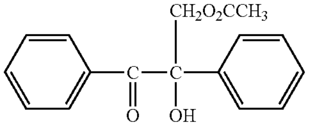

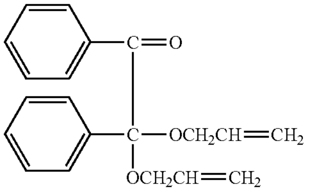

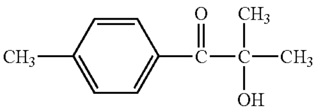

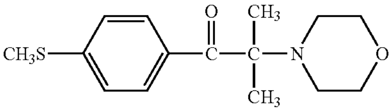

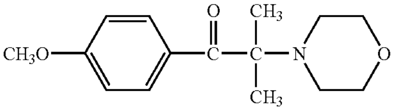

-continued

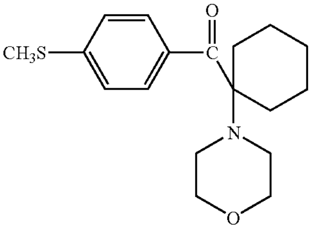

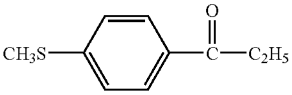

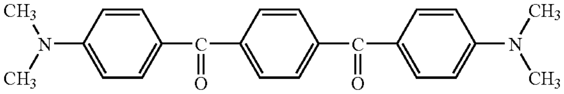

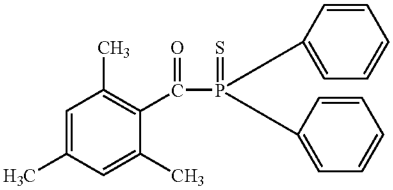

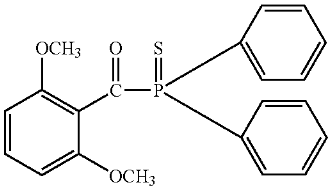

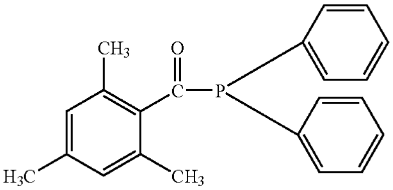

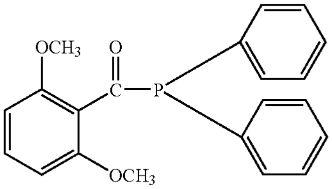

(b) Onium Salt Compounds (b) Onium salt compounds which are preferable as the radical polymerization initiator usable in the present invention, may include compounds represented by following formulae (1) to (3).

$$Ar^1—I^+—Ar^2 \quad (Z^2)^- \tag{1}$$

$$Ar^3—N^+{\equiv}N \quad (Z^3)^- \tag{2}$$

$$R^{23}R^{24}S^+—R^{25} \quad (Z^4)^- \tag{3}$$

In formula (1), $Ar^1$ and $Ar^2$ each independently represent an aryl group having up to 20 carbon atoms, which may be substituted; and $(Z^2)^-$ represents a counterion selected from the group consisting of a halogen ion, a perchlorate ion, a carboxylate ion, a tetrafluoroborate ion, a hexafluorophosphate ion and a sulfonate ion, and is preferably a perchlorate ion, a hexafluorophosphate ion or an arylsulfonate ion.

In formula (2), $Ar^3$ represents an aryl group having up to 20 carbon atoms, which may be substituted; and $(Z^3)^-$ represents the same counterion as defined for $(Z^2)^-$.

In formula (3), $R^{23}$, $R^{24}$ and $R^{25}$, which may be identical with or different from each other, each represent a hydrocarbon group having up to 20 carbon atoms, which may be substituted; and $(Z^4)^-$ represents the same counterion as defined for $(Z^2)^-$.

Specific examples of onium salts which may be suitably used in the present invention include those described in paragraphs [0030] to [0033] of JP-A No. 2001-133969 or those described in paragraphs [0015] to [0046] of JP-A No. 2001-343742, which have been previously suggested by the Applicant, and the specific aromatic sulfonium salt compounds described in JP-A Nos. 2002-148790, 2001-343742, 2002-6482, 2002-116539 and 2004-102031.

(c) Organic Peroxides (c) Organic peroxides which are preferable as the radical polymerization initiator usable in the present invention, may include nearly all of organic compounds having one or more oxygen-oxygen bonds in the molecule, but examples thereof include methyl ethyl ketone peroxide, cyclohexanone peroxide, 3,3,5-trimethylcyclohexanon peroxide, methylcyclohexanone peroxide, acetylacetone peroxide, 1,1-bis(tertiary-butylperoxy)-3,3,5-trimethylcyclohexane, 1,1-bis(tertiary-butylperoxy)cyclohexane, 2,2-bis(tertiary-butylperoxy) butane, tertiary-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tertiary-butyl peroxide, tertiary-butylcumyl peroxide, dicumyl peroxide, bis(tertiary-butylperoxyisopropyl)benzene, 2,5-dimethyl-2,5-di(tertiary-butylperoxy)hexane, 2,5-xanoyl peroxide, succinic acid peroxide, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tertiary-butyl peroxyacetate, tertiary-butyl peroxypivalate, tertiary-butyl peroxyneodecanoate, tertiary-butyl peroxyoctanoate, tertiary-butyl peroxy-3,5,5-trimethylhexanoate, tertiary-butyl peroxylaurate, tertiary-carbonate, 3,3',4,4'-tetra(t-butlperoxycarbonyl)benzophenone, 3,3',4,4'-tetra(t-amylperoxycarbonyl)benzophenone, 3,3'4,4'-tetra(t-hexylperoxycarbonyl)benzophenone, 3,3'4,4'-tetra-(t-octylperoxycarbonyl)benzophenone, 3,3',4,4'-tetra-(cumylperoxycarbonyl)benzophenone, 3,3'4,4'-tetra-(p-isopropylcumylperoxycarbonyl)benzophenone, carbonyl di(t-butylperoxy dihydrogen diphthalate), carbonyl di(t-hexylperoxy dihydrogen diphthalate), and the like.

Among them, peroxyesters such as 3,3',4,4'-tetra(t-butylperoxycarbonyl)benzophenone, 3,3'4,4'-tetra-(t-amylperoxycarbonyl)benzophenone, 3,3',4,4'-tetra-(t-hexylperoxycarbonyl)benzophenone, 3,3'4,4'-tetra-(t-octylperoxycarbonyl) benzophenone, 3,3',4,4'-tetra-(cumylperoxycarbonyl) benzophenone, 3,3'4,4'-tetra-(p-isopropylcumylperoxycarbonyl)benzophenone, and di-t-butyl diperoxyisophthalate are preferred.

(d) Thio Compound (d) Thio compounds which are preferable as the radical polymerization initiator usable in the present invention, may include compounds having a structure represented by following formula (4).

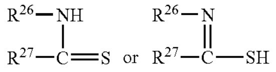

(4)

In formula (4), $R^{26}$ represents an alkyl group, an aryl group or a substituted aryl group; $R^{27}$ represents a hydrogen atom or an alkyl group; and $R^{26}$ and $R^{27}$ may be bound to each other to represent a non-metallic atomic group necessary for forming a 5- to 7-membered ring which may contain a heteroatom selected from an oxygen atom, a sulfur atom and a nitrogen atom.

Specific examples of the thio compound represented by formula (4) include the compounds shown below.

| No. | $R^{26}$ | $R^{27}$ |
|---|---|---|
| 1 | —H | —H |
| 2 | —H | $—CH_3$ |
| 3 | $—CH_3$ | —H |
| 4 | $—CH_3$ | $—CH_3$ |
| 5 | $—C_6H_5$ | $—C_2H_5$ |
| 6 | $—C_6H_5$ | $—C_4H_9$ |
| 7 | $—C_6H_4Cl$ | $—CH_3$ |
| 8 | $—C_6H_4Cl$ | $—C_4H_9$ |
| 9 | $—C_6H_4—CH_3$ | $—C_4H_9$ |
| 10 | $—C_6H_4—OCH_3$ | $—CH_3$ |
| 11 | $—C_6H_4—OCH_3$ | $—C_2H_5$ |
| 12 | $—C_6H_4—OC_2H_5$ | $—CH_3$ |
| 13 | $—C_6H_4—OC_2H_5$ | $—C_2H_5$ |
| 14 | $—C_6H_4—OCH_3$ | $—C_4H_9$ |
| 15 | $—(CH_2)_2—$ | |
| 16 | $—(CH_2)_2—S—$ | |
| 17 | $—CH(CH_3)—CH_2—S—$ | |
| 18 | $—CH_2—CH(CH_3)—S—$ | |
| 19 | $—C(CH_3)_2—CH_2—S—$ | |
| 20 | $—CH_2—C(CH_3)_2—S—$ | |
| 21 | $—(CH_2)_2—O—$ | |
| 22 | $—CH(CH_3)—CH_2—O—$ | |
| 23 | $—C(CH_3)_2—CH_2—O—$ | |
| 24 | $—CH{=}CH—N(CH_3)—$ | |
| 25 | $—(CH_2)_3—S—$ | |
| 26 | $—(CH_2)_2—CH(CH_3)—S—$ | |
| 27 | $—(CH_2)_3—O—$ | |
| 28 | $—(CH_2)_5—$ | |
| 29 | $—C_6H_4—O—$ | |
| 30 | $—N{=}C(SCH_3)—S—$ | |
| 31 | $—C_6H_4—NH—$ | |
| 32 | 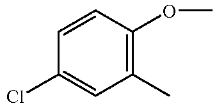 | |

(e) Hexaarylbiimidazole Compounds (e) Hexaarylbiimidazole compounds which are preferable as the radical polymerization initiator usable in the present invention, may include the rofin dimers described in JP-B Nos. 45-37377 and 44-86516, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, 2,2'-bis(o-triflourophenyl)-4,4',5,5'-tetraphenylbiimidazole, and the like.

(f) Keto Oxime Ester Compounds (f) Keto oxime ester compounds which are preferable as the radical polymerization initiator in the present invention, may include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one, 2-ethoxycarbonyloxyimino-1-phenylpropan-1-one, and the like.

(g) Borate Compounds (g) Borate compounds which are preferable as the radical polymerization initiator usable in the present invention, may include compounds represented by following formula (5).

(5)

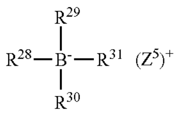

In formula (5), $R^{28}$, $R^{29}$, $R^{30}$ and $R^{31}$, which may be identical with or different from each other, each represent a substituted or unsubstituted alkyl group, a substituted or unsubstituted aryl group, a substituted or unsubstituted alkenyl group, a substituted or unsubstituted alkynyl group, or a substituted or unsubstituted heterocyclic group, or two or more groups of $R^{28}$, $R^{29}$, $R^{30}$ and $R^{31}$ may be bound to form a cyclic structure, with the proviso that at least one among $R^{28}$, $R^{29}$, $R^{30}$ and $R^{31}$ is a substituted or unsubstituted alkyl group; and $(Z^5)^+$ represents an alkali metal cation or a quaternary ammonium cation.

Specific examples of the compounds represented by formula (5) include the compounds described in U.S. Pat. Nos. 3,567,453 and 4,343,891, and European Patent Nos. 109,772 and 109,773, and the compounds shown below.

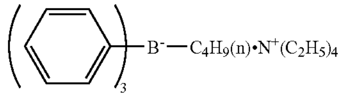

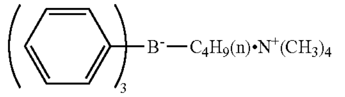

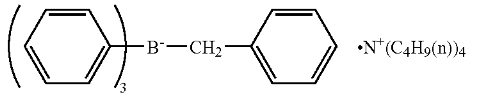

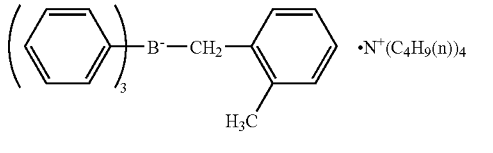

(h) Azinium Compounds (h) Azinium salt compounds which are preferable as the radical polymerization initiator usable in the present invention, include the family of compounds having an N—O bond as described in JP-A Nos. 63-138345, 63-142345, 63-142346 and 63-143537, and JP-B No. 46-42363.

(i) Metallocene Compounds (i) Metallocene compounds which are preferable as the radical polymerization initiator usable in the present invention, may include the titanocene compounds described in JP-A Nos. 59-152396, 61-151197, 63-41484, 2-249 and 2-4705, and the iron arene complexes described in JP-A Nos. 1-304453 and 1-152109.

Specific examples of the titanocene compounds include dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, bis(cyclopentadienyl)-bis(2,6-difluoro-3-(pyrr-1-yl)phenyltitaniumbis(cyclopentadienyl) bis[2,6-difluoro-3-(methylsulfonamido)phenyl]titanium, bis(cyclopentadienyl)bis[2,6-difluoro-3-(N-butylbiaroylamino)phenyl]titanium, bis(cyclopentadienyl)bis[2,6-difluoro-3-(N-butyl-(4-chloropbenzoyl)amino)phenyl]titanium, bis(cyclopentadienyl)bis[2,6-difluoro-3-(N-benzyl-2,2-dimehylpentanoylamino)phenyl]titanium, bis(cyclopentadienyl)bis[2,6-difluoro-3-(N-(2-ethylhexyl-4-tolylsulfonyl)amino)phenyl]titanium, bis(cyclopentadienyl) bis[2,6-difluoro-3-(N-(3-oxaheptyl)benzoylamino)phenyl] titanium, bis(cyclopentadienyl)bis[2,6-difluoro-3-(N-(3,6-dioxadecyl)benzoylamino)phenyl]titanium, bis(cyclopentadienyl)bis[2,6-difluoro-3-(trifluoromethylsulfonylamino)phenyl]titanium, bis(cyclopentadienyl)bis[2,6-difluoro-3-(trifluoroacetylamino) phenyl]titanium, bis(cyclopentadienyl)bis[2,6-difluoro-3-(2-chlorobenzoylamino)phenyl]titanium, bis(cyclopentadienyl)bis[2,6-difluoro-3-(4-chlorobenzoylamino)phenyl]titanium, bis(cyclopentadienyl) bis[2,6-difluoro-3-(N-(3,6-dioxadecyl)-2,2-dimethylpentanoylamino)phenyl]titanium, bis(cyclopentadienyl)bis[2,6-difluoro-3-(N-(3,7-dimethyl-7-methoxyoctyl)benzoylamino)phenyl]titanium, bis(cyclopentadienyl)bis[2,6-difluoro-3-(N-cyclohexylbenzoylamino)phenyl]titanium, and the like.

(j) Active Ester Compounds (j) Active ester compounds which are preferable as the radical polymerization initiator usable in the present invention, may include the imidosulfonate compounds described in JP-A No. 62-6223, and the active sulfonates described in JP-B No. 63-14340 and JP-A No. 59-174831.

(k) Compounds Having Carbon-Halogen Bond (k) Compounds having a carbon-halogen bond which are preferable as the radical polymerization initiator usable in the present invention, may include compounds represented by following formulae (6) to (12).

(6)

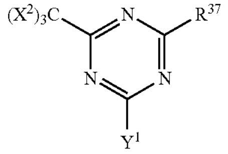

In formula (6), $X^2$ represents a halogen atom; $Y^1$ represents $—C(X^2)_3$, $—NH_2$, $—NHR^{38}$, $—NR^{38}$, or $—OR^{38}$; $R^{38}$ represents an alkyl group, a substituted alkyl group, an aryl group or a substituted aryl group; and $R^{37}$ represents $—C(X^2)_3$, an alkyl group, a substituted alkyl group, an aryl group, a substituted aryl group, or a substituted alkenyl group.

(7)

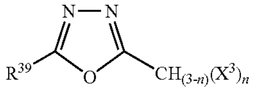

In formula (7), $R^{39}$ represents an alkyl group, a substituted alkyl group, an alkenyl group, a substituted alkenyl group, an aryl group, a substituted aryl group, a halogen atom, an alkoxy group, a substituted alkoxy group, a nitro group, or a cyano group; $X^3$ represents a halogen atom; and n represents an integer from 1 to 3.

(8)

$$R^{40}—Z^6—CH_{(2-m)}(X^3)_mR^{41}$$

In formula (8), $R^{40}$ represents an aryl group or a substituted aryl group; $R^{41}$ represents the groups shown below, or a halogen atom; $Z^6$ represents —C(═O)—, —C(═S)— or —$SO_2$—; $X^3$ represents a halogen atom; and m represents 1 or 2.

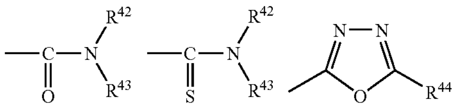

wherein $R^{42}$ and $R^{43}$ are each an alkyl group, a substituted alkyl group, an alkenyl group, a substituted alkenyl group, an aryl group or a substituted aryl group; and $R^{44}$ has the same meaning as defined for $R^{38}$ in formula (6).

(9)

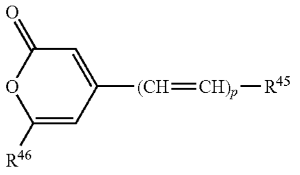

In formula (9), $R^{45}$ represents an aryl group or a heterocyclic group, each of which may be substituted; $R^{46}$ represents a trihaloalkyl group or a trihaloalkenyl group, each having 1 to 3 carbon atoms; and p represents 1, 2 or 3.

(10)

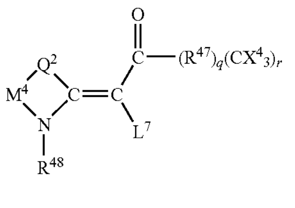

Formula (10) represents a carbonylmethylene heterocyclic compound having a trihalogenomethyl group. In formula (10), $L^7$ represents a hydrogen atom or a substituent of formula: CO—$(R^{47})_q(C(X^4)_3)_r$; $Q^2$ represents a sulfur atom, a selenium atom, an oxygen atom, a dialkylmethylene group, an alken-1,2-ylene group, a 1,2-phenylene group, or an N—R group; $M^4$ represents a substituted or unsubstituted alkylene or alkenylene group, or represents a 1,2-arylene group; $R^{38}$ represents an alkyl group, an aralkyl group or an alkoxyalkyl group; $R^{47}$ represents a carbocyclic or heterocyclic divalent aromatic group; $X^4$ represents a chlorine atom, a bromine atom or an iodine atom; and either q=0 and r=1, or q=1 and r=1 or 2.

(11)

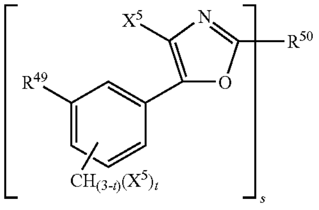

Formula (11) represents a 4-halogeno-5-(halogenomethylphenyl)oxazole derivative. In formula (11), $X^5$ represents a halogen atom; t represents an integer from 1 to 3; s represents an integer from 1 to 4; $R^{49}$ represents a hydrogen atom or a $CH_{3-t}X^5_t$ group; $R^{50}$ represents an unsaturated organic group having a valency of s, which may be substituted.

(12)

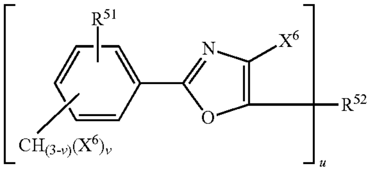

Formula (12) represents a 2-(halogenomethylphenyl)-4-halogeno-oxazole derivative. In formula (12), $X^6$ represents a halogen atom; v represents an integer from 1 to 3; u represents an integer from 1 to 4; $R^{51}$ represents a hydrogen atom or a $CH_{3-v}X^6_v$ group; and $R^{52}$ represents an unsaturated organic group having a valency of u, which may be substituted.

Specific examples of such compounds having a carbon-halogen bond include, for example, the compounds described in Wakabayashi, et al., Bull. Chem. Soc. Japan, 42, 2924 (1969), for example, 2-phenyl-4,6-bis(trichlormethyl)-S-triazine, 2-(p-chlorphenyl)-4,6-bis(trichlormethyl)-S-triazine, 2-(p-tolyl)-4,6-bis(trichlormethyl)-3-triazine, 2-(p-methoxyphenyl)-4,6-bis(trichlormethyl)-S-triazine, 2-(2',4'-dichlorphenyl)-4,6-bis(trichlormethyl)-S-triazine, 2,4,6-tris(trichlormethyl)-S-triazine, 2-methyl-4,6-bis(trichlormethyl)-S-triazine, 2-n-nonyl-4,6-bis(trichlormethyl)-S-triazine, 2-(α,α,β-trichlorethyl)-4,6-bis(trichlormethyl)-S-triazine, and the like. In addition, the compounds described in U.K. Patent No. 1388492, for example, 2-styryl-4,6-bis(trichlormethyl)-S-triazine, 2-(p-methylstyryl)-4,6-bis(trichlormethyl)-S-triazine, 2-(p-methoxystyryl)-4,6-bis(trichlormethyl)-S-triazine, 2-(p-methoxystyryl)-4-amino-6-trichlormethyl-S-triazine, and the like; the compounds described in JP-A No. 53-133428, for example, 2-(4-methoxy-naphth-1-yl)-4,6-bis-trichlormethyl-S-triazine, 2-(4-ethoxy-naphth-1-yl)-4,6-bis-trichlormethyl-S-triazine, 2-[4-(2-ethoxyethyl)-naphth-1-yl]-4,6-bis-trichlormethyl-S-triazine, 2-(4,7-dimethoxy-naphth-1-yl)-4,6-bis-trichlormethyl-S-triazine, 2-(acenaphth-5-yl)-4,6-bis-trichlormethyl-S-triazine, and the like; the compounds described in German Patent No. 3337024, for example, the compounds shown below; and the like may also be mentioned. Furthermore, there may be mentioned a family of compounds as shown below, which can be easily synthesized by a person having ordinary skill in the art according to the synthesis method described in M. P. Hutt, E. F. Elslager and L. M. Herbel, "Journal of Heterocyclic Chemistry", Vol. 7, No. 3, p. 511-(1970), for example, the following compounds.

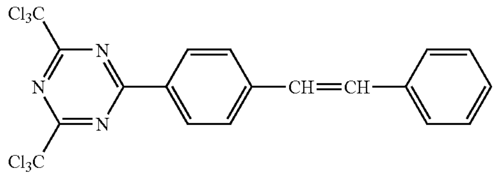

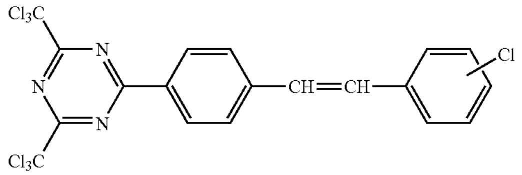

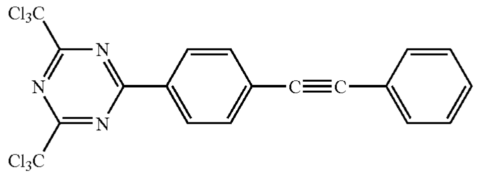

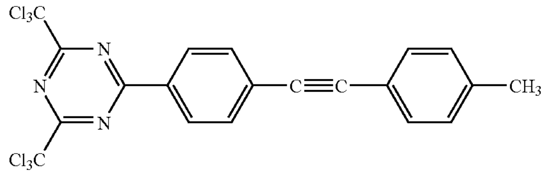

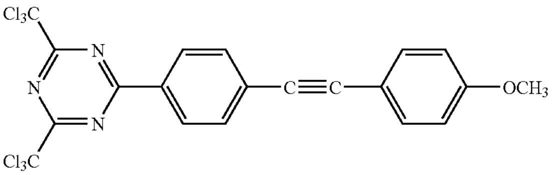

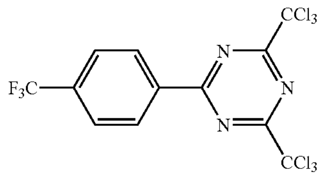

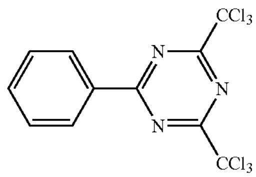

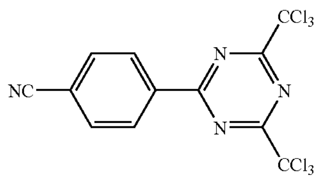

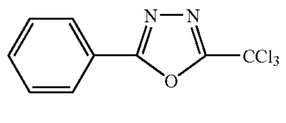

-continued

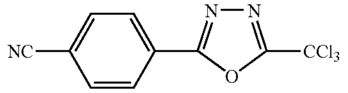

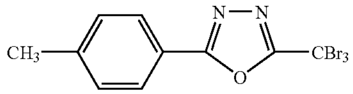

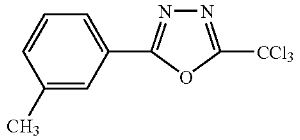

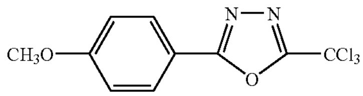

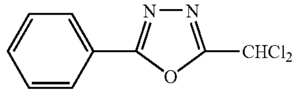

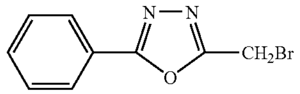

(l) Azo Compounds (l) Azo compounds which are preferable as the radical polymerization initiator usable in the present invention, may include 2,2'-azobisisobutyronitrile, 2,2'-azobispropionitrile, 1,1'-azobis(cyclohexane-1-carbonitrile), 2,2'-azobis(2-methylbutyronitrile), 2,2'-azobis(2,4-dimethylvaleronitrile), 2,2'-azobis(4-methoxy-2,4-dimethylvaleronitrile), 4,4'-azobis(4-cyanovaleric acid), dimethyl 2,2'-azobisisobutyrate, 2,2'-azobis(2-methylpropionamideoxime), 2,2'-azobis[2-(2-imidazolin-2-yl)propane], 2,2'-azobis{2-methyl-N-[1,1-bis(hydroxymethyl)-2-hydroxyethyl]propionamide}, 2,2'-azobis[2-methyl-N-(2-hydroxyethyl)propionamide], 2,2'-azobis(N-butyl-2-methylpropionamide), 2,2'-azobis(N-cyclohexyl-2-methylpropionamide), 2,2'-azobis[N-(2-propenyl)-2-methylpropionamide], 2,2'-azobis(2,4,4-trimethylpentane), and the like.

More preferred examples of the radical polymerization initiator for the present invention include the above-mentioned (a) aromatic ketones, (b) onium salt compounds, (c) organic peroxides, (e) hexaarylbiimidazole compounds, (i) metallocene compounds, and (k) compounds having a carbon-halogen bond, and most preferred examples thereof include aromatic iodonium salts, aromatic sulfonium salts, titanocene compounds, and trihalomethyl-S-triazine compounds represented by formula (6).

The polymerization initiators may be added in a proportion of preferably 0.01 to 10% by mass, and more preferably 0.1 to 3% by mass, based on the total solid content of the resin composition for laser engraving containing a polymerizable compound. The polymerization initiators are suitably used by using them individually alone, or in combination of two or more species.

(F) Plasticizer

The resin composition for laser engraving of the present invention preferably contains a plasticizer. Examples of the plasticizer include dioctyl phthalate, didodecyl phthalate, triethylene glycol dicaprylate, methyl glycol phthalate, tricresyl phosphate, dioctyl adipate, dibutyl sebacate, triacetylglycerin, and the like. Other examples of the plasticizer include polyethylene glycols, polypropylene glycol (mono-ol type or diol type), and polypropylene glycol (mono-ol type or diol type).

Since the plasticizer has an effect of softening the film formed from the resin composition for laser engraving, the agent needs to have good compatibility with the binder polymer. Generally, in regard to the binder polymer, a highly hydrophilic compound has good compatibility. Even among highly hydrophilic compounds, for example, an ether compound containing a heteroatom in a straight chain, or a compound having a structure in which a hydrophilic group such as secondary amine and a hydrophobic group are alternately repeated, are preferably used. This is because the presence of the hydrophilic group such as —O— or —NH— exhibits compatibility with PVA and derivatives thereof, and the other hydrophobic group weakens the intermolecular force of PVA and derivatives thereof, to thereby contribute to softening.

Furthermore, as the plasticizer, a compound having fewer hydroxyl groups which are capable of forming hydrogen bonding between PVA and derivatives thereof, is preferably used. Examples of such compound include ethylene glycol, propylene glycol, and dimers, trimers, and homo-oligomers or co-oligomers such as tetramer or higher-mers of ethylene glycol and propylene glycol, and secondary amines such as diethanolamine and dimethylolamine. Among these, ethylene glycols (monomers, dimers, trimers and oligomers) having small steric hindrance, excellent compatibility and low toxicity, are particularly preferably used as the plasticizer (F).

Ethylene glycols are roughly classified into three types according to the molecular weight. The first group includes ethylene glycol which is a monomer, the second group includes diethylene glycol which is a dimer and triethylene glycol which is a trimer, and the third group includes polyethylene glycol which is a tetramer or higher-mer. Polyethylene glycol is roughly classified into liquid polyethylene glycol having a molecular weight in the range of 200 to 700, and solid polyethylene glycol having a molecular weight of 1000 or greater, and those commercially available under names followed by the average molecular weight, may also be used.

Since a lower molecular weight of the plasticizer enhances the effects of softening a resin, compounds which may be particularly preferably used as the plasticizer are ethylene glycol which belongs to the first group, diethylene glycol and triethylene glycol which belong to the second group, and tetraethylene glycol (tetramer) which belongs to the third group, but among them, more preferably used plasticizers from the viewpoints of low toxicity, absence of extraction from the resin composition, and excellent handlability, are diethylene glycol, triethylene glycol and tetraethylene glycol. Mixtures of two or more of these are also preferably used.

The plasticizer may be added in a proportion of 10% by mass or less based on the total mass of the solid content of the resin composition for laser engraving.

(G) Additives for Enhancing Engraving Sensitivity

Nitrocellulose

As an additive for enhancing the engraving sensitivity, it is more preferable to add nitrocellulose. Because nitrocellulose is a self-reactive compound, it is presumed that the compound emits heat per se at the time of laser engraving, and assists thermal decomposition of the co-present binder polymer such as a hydrophilic polymer, and as a result, the engraving sensitivity is enhanced.

The type of nitrocellulose is not particularly limited as long as it is capable of thermal decomposition, and any of RS (regular soluble) type, SS (spirit soluble) type and AS (alcohol soluble) type is acceptable. The nitrogen content of nitrocellulose is usually about 10 to 14% by mass, preferably 11 to 12.5% by mass, and more preferably about 11.5 to 12.2% by mass. The degree of polymerization of nitrocellulose may also be selected in a wide range of about 10 to 1500. A preferred degree of polymerization of nitrocellulose is, for example, 10 to 900, and particularly about 15 to 150. Preferred examples of the nitrocellulose include those nitrocelluloses having a solution viscosity measured according to JIS K6703 "Nitrocelluloses for Industrial Use" (method of viscosity indication by Hercules Powder Company) of 20 to 1/10 seconds, and preferably about 10 to 1/8 seconds. As for the nitrocellulose, a nitrocellulose having a solution viscosity of 5 to 1/8 seconds, and particularly about 1 to 1/8 seconds, can be used.

Furthermore, as for a nitrocellulose which can be contained by the resin composition for laser engraving, a nitrocellulose of RS type (for example, a nitrocellulose having a nitrogen content of about 11.7 to 12.2%) which is soluble in a ester such as ethyl acetate, a ketone such as methyl ethyl ketone or methyl isobutyl ketone, or an ether such as cellosolve, may be used.

Nitrocelluloses may be used in combination of two or more species as necessary. The content of nitrocellulose may be selected in the range of not lowering the sensitivity of the resin composition for laser engraving, and the content is, for example, 5 to 300 parts by mass, preferably 20 to 250 parts by mass, more preferably 50 to 200 parts by mass, and particularly preferably 40 to 200 parts by mass, relative to 100 parts by mass of the binder polymer and the polymerizable compound.

Highly Thermally Conductive Substance

As an additive for enhancing the engraving sensitivity, it is more preferable to add a highly thermally conductive substance for the purpose of assisting in heat transfer.

Examples of the highly thermally conductive substance include inorganic compounds such as metal particles, and organic compounds such as electrically conductive polymers.

As for the metal particles, gold microparticles, silver microparticles and copper microparticles, each having a particle size in the order of micrometers to a few nanometers, are preferred.

As for the electrically conductive polymers, those generally known electrically conductive polymers may be suitably used. Among the electrically conductive polymers, conjugated polymers are particularly preferred, and specifically, polyaniline, polythiophene, polyisothiaznaphthene, polypyrrole, polyethylene dioxythiophene, polyacetylene and derivatives thereof are preferred. From the viewpoint of being highly sensitive, polyaniline, polythiophene, polyethylene dioxythiophene and derivatives thereof are more preferred, and polyaniline is particularly preferred. In the case of using polyaniline, it may be added in the form of either emeraldine base or emeraldine salt, but emeraldine salt is preferred from the viewpoint of having higher heat transfer efficiency.

As the metal particles and electrically conductive polymers, commercially available products supplied by Sigma Aldrich Corp., Wako Pure Chemical Industries, Ltd., Tokyo Chemical Industry Co., Ltd., Mitsubishi Rayon Co., Ltd., Panipol Oy, and the like may also be used. For example, the most preferred in view of enhancing the heat transfer efficiency are "AQUAPASS-01X" (manufactured by Mitsubishi Rayon Co., Ltd.), "PANIPOL-W" (manufactured by Panipol Oy), and "PANIPOL-F" (manufactured by Panipol Oy).

In the case of using an electrically conductive polymer, the polymer is preferably added to the resin composition in the form of an aqueous dispersion or an aqueous solution. This is because, as described above, since hydrophilic polymers and alcoholphilic polymers may be mentioned as a preferred aspect of the binder polymer in the present invention, and in the case of using such a polymer, the solvent which may be used in preparing the resin composition for laser engraving is water or an alcohol-based solvent, when the electrically conductive polymer is added in the form of an aqueous dispersion or aqueous solution, the compatibility with a hydrophilic or alcoholphilic polymer would become good, and furthermore, the strength of the film formed from the resin composition for laser engraving would be enhanced, while the engraving sensitivity derived from the enhancement of thermal transfer efficiency may also be enhanced.

(H) Co-Sensitizer

By using a co-sensitizer, the sensitivity required at the time of photocuring the resin composition for laser engraving may be further enhanced. The operating mechanism, although not clear, is thought to be largely based on the following chemical process. That is, it is presumed that various intermediate active species (radicals and cations) generated in the course of a photoreaction initiated by a polymerization initiator and an addition polymerization reaction subsequent thereto, react with the co-sensitizer to generate new active radicals. These intermediate active species may be roughly classified into (a) compounds which are reduced and can generate active radicals; (b) compounds which are oxidized and can generate active radicals; and (c) compounds which react with less active radicals, and are converted to more active radicals or act as a chain transfer agent. However, in many cases, there is no general theory applicable on which individual compound belongs to which class. Examples of the co-sensitizer which may be applied in the present invention include the following compounds.

(a) Compounds Which are Reduced to Enerate Active Radicals

Compounds having a carbon-halogen bond: It is presumed that the carbon-halogen bond is cleaved, and thereby an active radical is generated. Specifically, for example, trihalomethyl-s-triazines or trihalomethyloxadiazoles may be suitably used.

Compounds having a nitrogen-nitrogen bond: It is presumed that the nitrogen-nitrogen bond is reductively cleaved, and thereby an active radical is generated. Specifically, hexaarylbiimidazoles may be suitably used.

Compounds having an oxygen-oxygen bond: It is presumed that the oxygen-oxygen bond is reductively cleaved, and thereby an active radical is generated. Specifically, organic peroxides may be suitably used.

Onium compounds: It is presumed that a carbon-heteroatom bond or an oxygen-nitrogen bond is reductively cleaved, and thereby an active radical is generated. Specifically, for example, diaryliodonium salts, triarylsulfonium salts, N-alkoxypyridinium salts (azinium) salts, and the like may be suitably used. Ferrocenes, iron arene complexes: An active radical may be reductively generated.

(b) Compounds Which are Oxidized and Generate Active Radicals

Alkylate complexes: It is presumed that a carbon-heteroatom bond is oxidatively cleaved, and thereby an active radical is generated. Specifically, for example, triarylalkylborates may be suitably used.

Alkylamine compounds: It is presumed that a C—X bond on a carbon atom which is adjacent to a nitrogen atom is cleaved through oxidation, and thereby an active radical is generated. As for X, a hydrogen atom, a carboxyl group, a trimethylsilyl group, a benzyl group and the like are suitable. Specifically, for example, ethanolamines, N-phenylglycine, N-trimethylsilylmethylanilines, and the like may be mentioned.

Sulfur-containing or tin-containing compounds: Compounds in which the nitrogen atom of the above-mentioned amines has been substituted by a sulfur atom or a tin atom, may generate an active radical by a similar action. Compounds having an S—S bond are also known to have enhanced sensitivity by the S—S bond cleavage.

α-substituted methylcarbonyl compounds: An active radical may be generated by the cleavage of a bond between a carbonyl moiety and an α-carbon atom through oxidation. Furthermore, compounds in which the carbonyl moiety has been converted to oxime ether, also show a similar action. Specifically, there may be mentioned 2-alkyl-1-[4-(alkylthio)phenyl]-2-morpholinopronone-1's, and oxime ethers in which a 2-alkyl-1-[4-(alkylthio)phenyl]-2-morpholinopronone-1 has been reacted with a hydroxylamine, and then the N—OH moiety has been etherified.

Sulfinic acid salts: An active radical may be reductively generated. Specifically, sodium arylsulfinate and the like may be mentioned.

(c) Compounds which react with less active radicals, and are converted to more active radicals or act as a chain transfer agent As for such compounds, for example, a family of compounds having SH, PH, SiH or GeH within the molecule may be used. These compounds may generate a radical by donating hydrogen to a less active radical species, or may generate a radical by being oxidized and then deprotonated. Specifically, for example, 2-mercaptobenzothiazoles, 2-mercaptobenzoxazoles, 2-mercaptobenzimidazoles, and the like may be mentioned.

As more specific examples of these co-sensitizers, many are described in, for example, JP-A No. 9-236913, as additives for enhancing the sensitivity, and those may also be applied to the present invention. Some examples thereof will be shown below, but the present invention is not intended to be limited to these. Additionally, in the following formulae, —TMS represents a trimethylsilyl group.

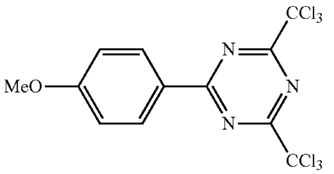

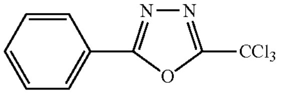

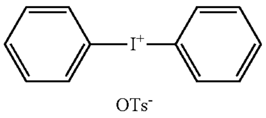

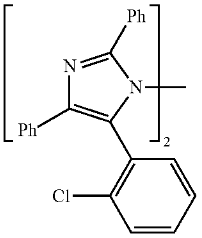

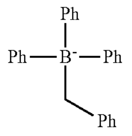

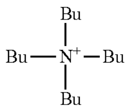

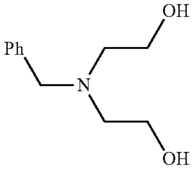

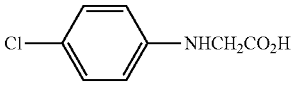

-continued

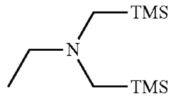

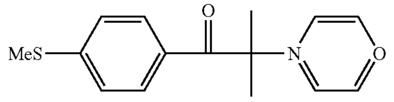

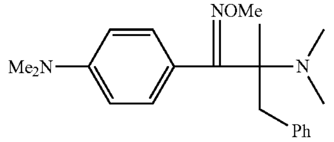

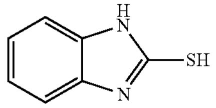

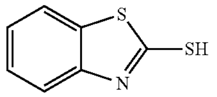

With regard to the co-sensitizer, as in the case of the previously mentioned photothermal conversion agent, various chemical modifications for improving the properties of the resin composition for laser engraving may also be carried out. For example, methods such as bonding with a photothermal conversion agent or a polymerizable compound (C), or with some other part, introduction of a hydrophilic site, enhancement of compatibility, introduction of a substituent for suppressing crystal precipitation, introduction of a substituent for enhancing adhesiveness, and conversion into a polymer, may be used.

The co-sensitizers may be used individually alone, or in combination of two or more species. The content of the co-sensitizer in the resin composition for laser engraving is preferably 0.05 to 100 parts by mass, more preferably 1 to 80 parts by mass, and even more preferably 3 to 50 parts by mass, relative to 100 parts by mass of the polymerizable compound.

(I) Polymerization Inhibitor

According to the present invention, it is preferable to add a small amount of thermopolymerization inhibitor, so as to inhibit unnecessary thermal polymerization of the polymerizable compound during the production or storage of the composition. Suitable examples of the thermopolymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxylamine cerium (I) salt, and the like.

Furthermore, as the polymerization inhibitor, Q-1301 (a 10% tricresyl phosphate solution; manufactured by Wako Pure Chemical Industries, Ltd.) is preferred, from the viewpoint that it has very excellent stability when the relief printing plate precursor for laser engraving obtained by forming a relief forming layer using the resin composition for laser engraving of the present invention. When Q-1301 is used in combination with a polymerizable compound, the storage stability of the relief printing plate precursor for laser engraving becomes significantly excellent, and good laser engraving sensitivity may be obtained. The amount of addition of the thermopolymerization inhibitor is preferably 0.01% by mass to 5% by mass, based on the total mass of the resin composition for laser engraving. Also, if necessary, in order to prevent the inhibition of polymerization by oxygen, a higher fatty acid derivative such as behenic acid or behenic acid amide may be added and localized at the surface of a coating layer formed during the course of drying after the resin composition is applied on a support or the like. The amount of addition of the higher fatty acid derivative is preferably 0.5 to 10% by mass based on the total mass of the composition.

(J) Colorant

A colorant such as a dye or a pigment may also be added for the purpose of coloring the resin composition for laser engraving. Thereby, the visibility of the image part, or a property called suitability for image density measuring device may be enhanced. As the colorant, it is particularly preferable to use a pigment. Specific examples of the colorant include pigments such as phthalocyanine-based pigments, azo-based pigments, carbon black and titanium oxide; and dyes such as Ethyl Violet, Crystal Violet, azo-based dyes, anthraquinone-based dyes and cyanine-based dyes. The amount of addition of the colorant is preferably about 0.5 to 5% by mass based on the total mass of the composition.

(K) Other Additives

In order to improve the properties of a cured film of the resin composition for laser engraving, known additives such as a filler may also be added.

Examples of the filler include carbon black, carbon nanotubes, fullerene, graphite, silica, alumina, aluminum, calcium carbonate and the like, and these fillers are used individually or as mixtures.

2. Relief Printing Plate Precursor for Laser Engraving

The relief printing plate precursor for laser engraving of the present invention has a relief forming layer which is formed from the resin composition for laser engraving of the present invention. It is preferable that the relief forming layer be provided on a support.

The relief printing plate precursor for laser engraving may further have, as necessary, an adhesive layer between the support and the relief forming layer, and a slip coat layer and a protective film on the relief forming layer.

Relief Forming Layer

The relief forming layer is a layer formed from the resin composition for laser engraving of the present invention. If a crosslinkable resin composition is used as the resin composition for laser engraving, a crosslinkable relief forming layer may be obtained. As for the relief printing plate precursor for laser engraving of the present invention, it is preferable to have a crosslinkable relief forming layer.

As an embodiment for producing a relief printing plate from the relief printing plate precursor for laser engraving, it is preferable to crosslink the relief forming layer, and then performing laser engraving to form a relief layer, and to thereby produce a relief printing plate. By crosslinking the relief forming layer, the abrasion of the relief layer at the time of printing may be prevented, and after the laser engraving, a relief printing plate having a sharp-shaped relief layer may be obtained.

The content of the binder polymer in the relief forming layer is preferably 30 to 80% by mass, and more preferably 40 to 70% by mass, based on the total mass of the solid content of the relief forming layer. It is because, when the content of the binder polymer is set to 30% by mass or more, cold flow of the printing plate precursor can be prevented, and when the content is set to 80% by mass or less, there is no insufficiency of other components, and a print durability sufficient for the use of the relief printing plate precursor as a relief printing plate may be obtained.

The content of the polymerization initiator in the relief forming layer is preferably 0.01 to 10% by mass, and more preferably 0.1 to 3% by mass, based on the total mass of the solid content of the relief forming layer. It is because, when the content of the polymerization initiator is set to 0.01% by mass or more, crosslinking of the crosslinkable relief forming layer may occur rapidly, and when the content is set to 10% by mass or less, there is no insufficiency of other components, and a print durability sufficient for the use of the relief printing plate precursor as a relief printing plate may be obtained.

The content of the polymerizable compound in the relief forming layer is preferably 10 to 60% by mass, and more preferably 15 to 40% by mass, based on the total mass of the solid content of the relief forming layer. It is because, when the content of the polymerizable compound is set to 10% by mass or more, a print durability sufficient for the use of the relief printing plate precursor as a relief printing plate may be obtained, and when the content is set to 60% by mass or less, a strength sufficient for the use of the relief printing plate precursor as a relief printing plate may be obtained.

The relief forming layer may be formed by forming the resin composition for laser engraving of the present invention into a sheet shape or a sleeve shape.

Support

A support which may be used in the relief printing plate precursor for laser engraving will be explained.

The material usable in the support of the relief printing plate precursor for laser engraving is not particularly limited, but a material having high dimensional stability is preferably used, and examples thereof include metals such as steel, stainless steel and aluminum; plastic resins such as polyesters (for example, PET, PBT and PAN) and polyvinyl chloride; synthetic rubber such as styrene-butadiene rubber; and plastic resins (epoxy resin, phenolic resin, and the like) reinforced with glass fiber. As for the support, a PET (polyethylene terephthalate) film or a steel substrate is preferably used. The form of the support is determined by whether the relief forming layer is sheet-shaped or sleeve-shaped.

Adhesive Layer

Between the relief forming layer and the support, an adhesive layer may also be provided for the purpose of increasing the adhesive power.

As for the material which may be used for the adhesive layer, a material which is capable of consolidating the adhesive power after the relief forming layer has been crosslinked, is desirable, and a material which is capable of consolidating the adhesive power even before the relief forming layer is crosslinked, is preferable. Here, the adhesive power means both the adhesive power between a support and an adhesive layer, and the adhesive power between an adhesive layer and a relief forming layer.

The adhesive power between a support and an adhesive layer is preferably such that, when an adhesive layer and a relief forming layer are peeled off from a laminate including a support, an adhesive layer and a relief forming layer, at a rate of 400 mm/min, it is preferable that the peel force per a unit width of 1 cm of a sample be 1.0 N/cm or larger, or be unpeelable, or it is more preferable that the peel force be 3.0 N/cm or larger, or be unpeelable.

The adhesive power between an adhesive layer and a relief forming layer is preferably such that, when an adhesive layer is peeled off from a laminate of an adhesive layer and a relief forming layer, at a rate of 400 mm/min, it is preferable that the peel force per a unit width of 1 cm of a sample be 1.0 N/cm or larger, or be unpeelable, or it is more preferable that the peel force be 3.0 N/cm or larger, or be unpeelable.

As for the material (adhesive) which may be used for the adhesive layer, for example, those described in I. Skeist, ed., “Handbook of Adhesives”, 2nd Edition (1977) may be used.

Protective Film, Slip Coat Layer

The relief forming layer becomes the part at which a relief is formed after the laser engraving (relief layer), and the surface of the relief layer surface functions as an ink deposition area. Since the relief forming layer after crosslinking is having been strengthened by crosslinking, there is hardly any chance of damages or depressions being generated on the surface of the relief forming layer to the extent that printing would be affected. However, the relief forming layer before crosslinking frequently has insufficient strength, and thus the surface is prone to have damages or depressions. From that point of view, the relief forming layer may be provided with a protective film on the surface for the purpose of preventing any damages and depressions on the surface of the relief forming layer.

As for the protective film, if the film is too thin, the effect of preventing damages and depressions may not be obtained, and if the film is too thick, the handling may become inconvenient, with high production costs. Therefore, the thickness of the protective film is preferably 25 μm to 500 μm, and more preferably 50 μm to 200 μm.

As for the protective film, materials known as the protective film of the printing plate, for example, polyester-based films such as of PET (polyethylene terephthalate), and polyolefin-based films such as of PE (polyethylene) or PP (polypropylene) may be used. Also, the surface of the film may be plain, or may also be matt.

In the case of providing a protective film on the relief forming layer, the protective film must be peelable.

If the protective film is unpeelable, or on the contrary, difficult to be adhered to the relief forming layer, a slip coat layer may be provided between the two layers.

As the material usable for the slip coat layer, those containing a water-soluble or water-dispersible and less tacky resin as the main component, such as polyvinyl alcohol, polyvinyl acetate, partially saponified polyvinyl alcohols, hydroxyalkylcelluloses, alkylcelluloses and polyamide resins, are preferred, and among these, from the viewpoint of adhesiveness, partially saponified polyvinyl alcohols having a degree of saponification of 60 to 99% by mole, and hydroxyalkylcelluloses and alkylcelluloses having alkyl groups with 1 to 5 carbon atoms are particularly preferably used.

In the case where a protective film is peeled off from a laminate of a relief forming layer (and a slip coat layer) and a protective film at a rate of 200 mm/min, it is preferable that the peel force per a unit width of 1 cm be 5 to 200 mN/cm, and more preferably 10 to 150 mN/cm. When the peel force is 5 mN/cm or more, the operation may be carried out without the protective film being peeled off in the middle of the operation, and when the peel force is 200 mN/cm or less, the protective film may be peeled off comfortably.

Method for Producing Relief Printing Plate Precursor for Laser Engraving

Next, the method for producing a relief printing plate precursor for laser engraving will be explained.

The formation of the relief forming layer in a relief printing plate precursor for laser engraving is not particularly limited, but there may be mentioned, for example, a method of preparing a coating solution composition for relief forming layer (resin composition for laser engraving), removing the solvent from this coating solution composition for relief forming layer, and then melt extruding the composition on a support. Alternatively, a method of flow casting the coating solution composition for relief forming layer on a support, and drying the resultant in an oven to remove the solvent from the coating solution composition, may also be used.

Thereafter, a protective film may be laminated on the relief forming layer according to necessity. The laminating process may be carried out by pressing a protective film and the relief forming layer with a heated calendar roll or the like, or by closely adhering a protective film onto a relief forming layer which has been impregnated with a small amount of solvent on the surface.

In the case of using a protective film, a method of first laminating a relief forming layer on the protective film, and then laminating a support, may be employed.

In the case of providing an adhesive layer, a support coated with an adhesive layer may be optionally used. In the case of providing a slip coat layer, a protective film coated with a slip coat layer may be optionally used.

The coating solution composition for relief forming layer may be produced by, for example, dissolving a binder polymer, an acetylene compound and as optional components, a photothermal conversion agent and a plasticizer in an appropriate solvent, and then dissolving a polymerization initiator and a polymerizable compound.

Since it is necessary to remove most of the solvent component at the stage of producing the printing plate precursor, it is preferable to use a low molecular weight alcohol (for example, ethanol), which is highly volatile, as the solvent, and to maintain the total amount of addition of the solvent as small as possible. By maintaining the system at a high temperature, the amount of addition of the solvent may be suppressed; however, if the temperature is too high, the polymerizable compound is likely to undergo a polymerization reaction, and therefore, the temperature for the preparation of the coating solution composition after the addition of the polymerizable compound and/or polymerization initiator, is preferably set to 30° C. to 80° C.

The thickness of the relief forming layer in the relief printing plate precursor for laser engraving, before and after being crosslinked, is preferably 0.05 mm to 10 mm, more preferably 0.05 mm to 7 mm, and particularly preferably 0.05 mm to 0.3 mm or less.

3. Relief Printing Plate and Production Thereof

The method for producing a relief printing plate of the present invention includes the processes of: (1) crosslinking the relief forming layer in the relief printing plate precursor for laser engraving of the present invention by means of irradiation with active radiation and/or heating, and (2) laser engraving the crosslinked relief forming layer to thereby form a relief layer. By this method for producing a relief printing plate of the present invention, the relief printing plate of the present invention having a relief layer on a support may be produced.

The method for producing a relief printing plate of the present invention may further include the following processes (3) to (5), if necessary, subsequent to the process (2).

Process (3): Rinsing the engraved surface relief layer obtained after the laser engraving, with water or with a liquid containing water as a main component thereof (Rinsing process).

Process (4): Drying the engraved relief layer (Drying process).

Process (5): Applying energy to the relief layer obtained after the laser engraving, to further crosslink the relief layer (Post-crosslinking process).

The crosslinking of the relief forming layer in the process (1) is carried out by irradiation with active radiation and/or heating. When, in the crosslinking of the relief forming layer of process (1), a process of crosslinking by light and a process of crosslinking by heat are used in combination, these processes may be simultaneous processes, or may be separate processes.

The process (1) is a process for crosslinking the relief forming layer of a relief printing plate precursor for laser engraving by light and/or heat.

The relief forming layer preferably contains a binder polymer, an acetylene compound, a photothermal conversion agent, a polymerization initiator, and a polymerizable compound, and the process (1) is a process of polymerizing the polymerizable compound under the action of the polymerization initiator to form crosslinking.

The polymerization initiator is preferably a radical generator, radical generators being roughly classified into photopolymerization initiators and thermopolymerization initiators, depending on whether the trigger of generating radicals is light or heat.

When the relief forming layer contains a photopolymerization initiator, the relief forming layer may be crosslinked by irradiating the relief forming layer with active radiation which serves as the trigger of the photopolymerization initiator (process of crosslinking by light).

The irradiation with active radiation is generally carried out over the entire surface of the relief forming layer. Examples of the active radiation include visible light, ultraviolet radiation and an electron beam, but ultraviolet radiation is most generally used. If the support-facing side of the relief forming layer is taken as the rear surface, it is acceptable to irradiate only the front surface with active radiation, but if the support is a transparent film which transmits active radiation, it is preferable to irradiate the active radiation also from the rear surface. If a protective film is present, irradiation from the front surface may be carried out with the protective film being provided, or may be carried out after the protective film has been removed. In the presence of oxygen, since there is a risk of polymerization inhibition, the irradiation with active radiation may also be carried out after coating the crosslinkable relief forming layer with a vinyl chloride sheet, and forming a vacuum.

When the relief forming layer contains a thermopolymerization initiator (the above-mentioned photopolymerization initiator may also serve as the thermopolymerization initiator), the relief forming layer may be crosslinked by heating the relief printing plate precursor for laser engraving (a process of crosslinking by heat). The method of heating may include a method of heating the printing plate precursor in a hot air oven or a far-infrared oven for a predetermined time, or a method of contacting the printing plate precursor with a heated roll for a predetermined time.

If the process (1) is a process of crosslinking by light, although the apparatus for irradiating active radiation is relatively expensive, since the temperature of the printing plate precursor never becomes high, there is almost no restriction in the choice of raw material for the printing plate precursor.

If the process (1) is a process of crosslinking by heat, it is advantageous in that special or expensive apparatuses are not needed, but since the printing plate precursor is heated to a high temperature, materials such as thermoplastic polymers which soften at high temperatures may deform during heating, and thus it is necessary to select the raw material to be used carefully.

In the case of thermal crosslinking, a thermopolymerization initiator may be added. As the thermopolymerization initiator, commercially available thermopolymerization initiators for free radical polymerization may be used. Examples of thermopolymerization initiators include appropriate peroxides, hydroperoxides, and compounds containing azo groups. Representative vulcanizers may also be used for crosslinking. Thermal crosslinking can also be carried out when a heat-curable resin, for example, an epoxy resin, is added to the layer as a crosslinkable component.

As for the method of crosslinking the relief forming layer in the process (1), crosslinking by heat is preferred from the viewpoint that the relief forming layer may be cured (crosslinked) uniformly from the surface to the inner part thereof.

When the relief forming layer is crosslinked, there are advantages such as that, firstly, the relief formed after laser engraving becomes well-defined, and secondly, the adhesiveness of the engraving remnants generated during laser engraving is suppressed. When an uncrosslinked relief forming layer is laser engraved, due to the residual heat propagated to the peripheries of the laser irradiated part, parts originally unintended for laser irradiation are prone to melt and deform, and in some cases, a well-defined relief forming layer may not be obtained. Furthermore, as a general property of materials, a material having a lower molecular weight tends to be liquid instead of solid, that is to say, the material tends to become more adhesive. The engraving remnants generated at the time of engraving the relief forming layer, tend to become more adhesive, to the extent that materials having low molecular weights are used. Since a polymerizable compound having a low molecular weight becomes a polymer through the crosslinking, the engraving remnants generated therefore tend to be less adhesive.

The process (2) is a process for forming a relief layer by laser engraving the crosslinked relief forming layer. Specifically, a relief layer is formed by performing engraving by irradiating the crosslinked relief forming layer with a laser light corresponding to a desired image to be formed. Preferably, the laser head is controlled with a computer based on the digital data of a desired image to be formed, thereby performing scanning irradiation over the relief forming layer. When an infrared laser is irradiated, the molecules in the relief forming layer undergo molecular vibration, and thus heat is generated. When a high power laser such as a carbon dioxide laser or a YAG laser is used as the infrared laser, a large amount of heat is generated at the laser-irradiated areas, and the molecules in the photosensitive layer undergo molecular breakage or ionization, so that selective removal, that is, engraving, is achieved. An advantage of laser engraving is that since the depth of engraving can be arbitrarily set, the structure may be three-dimensionally controlled. For example, when areas for printing fine dots are engraved shallowly or with a shoulder, the relief may be prevented from collapsing under printing pressure. When groove areas for printing cutout characters are engraved deeply, it becomes difficult for ink to fill into the grooves, and collapse of the cutout characters may be suppressed. Moreover, when engraving is performed with an infrared laser which corresponds to the wavelength of maximum absorption of the photothermal conversion agent, a more sensitive and well-defined relief layer may be obtained.

If engraving remnants remain adhered to the engraved surface, a process (3) for rinsing the engraved surface with water or with a liquid containing water as a main component to wash away the engraving remnants, may be further performed. Rinsing methods may include a method of spraying water at high pressure, or a method of brush rubbing the engraved surface, mainly in the presence of water, using a batch type or conveyor type brush washout machine known as a developing machine for photosensitive resin letterpress plates, or the like. If the viscous liquid of the engraving remnants cannot be removed, a rinsing solution including soap may be used.

When performing process (3) of rinsing the engraved surface, it is preferable to add a process (4) for drying the engraved relief forming layer to volatilize the rinsing solution. Furthermore, if necessary, a process (5) for further crosslinking the relief forming layer may also be added. By carrying out the process of further crosslinking (5), the relief formed by engraving may be further strengthened.

By carrying out the processes described above, the relief printing plate of the present invention having a relief layer on a support may be obtained. The thickness of the relief layer of the relief printing plate is preferably from 0.05 mm to 10 mm, more preferably from 0.05 mm to 7 mm, and particularly preferably from 0.05 mm to 0.3 mm, from the viewpoint of satisfying requirements for various flexographic printing properties such as abrasion resistance and ink transferability.

The Shore A hardness of the relief layer of the relief printing plate is preferably from 50° to 90°.

When the Shore A hardness of the relief layer is 50° or more, the fine dots formed by engraving do not fall and break even under the high printing pressure of a letterpress printing machine, and proper printing may be achieved. When the Shore A hardness of the relief layer is 90° or less, even in flexographic printing with a kiss-touch printing pressure, print scratches at solid parts may be prevented.

Here, the Shore A hardness as used in the present specification is a value obtained by deforming the surface of a test subject by indenting an indenter (called as a press needle or an indenter), and measuring the amount of deformation (depth of indentation) with a durometer (spring type rubber hardness meter) which measures and digitalize the amount of deformation.

The relief printing plate produced by the method of the present invention allows printing with a letterpress printing machine using oily ink or UV ink, and also allows printing with a flexographic printing machine using UV ink.

As discussed above, according to the present invention, a resin composition for laser engraving which shows high engraving sensitivity when subjected to laser engraving, can be provided. Also, according to the present invention, a relief printing plate precursor for laser engraving which has high engraving sensitivity and allows direct plate making by laser engraving, a method for producing a relief printing plate using the relief printing plate precursor, and a relief printing plate obtained by the method can be provided.

EXAMPLES

Hereinafter, the present invention will be described in more detail by way of Examples, but the present invention is not intended to be limited to these Examples.

Example 1

1. Preparation of Crosslinkable Resin Composition for Laser Engraving

In a three-necked flask equipped with a stirring blade and a cooling tube, 3 parts by mass of AC-1 (an acetylene compound having the following structure, manufactured by Wako Pure Chemical Industries, Ltd.), 54 parts by mass of GOHSENAL T-215 (a PVA derivative, manufactured by Nippon Synthetic Chemical Industry Co., Ltd.) as a binder polymer, 1 part by mass of KETJENBLACK EC600JD (carbon black, manufactured by Lion Corporation) as a photothermal conversion agent, 20 parts by mass of diethylene glycol as a plasticizer, and 47 parts by mass of water as a solvent were placed, and the mixture was heated at 70° C. for 120 minutes while stirred, to dissolve the polymer. Furthermore, 25 parts by mass of an ethylenic unsaturated monomer, DPHA (dipentaerythritol hexaacrylate, manufactured by Toagosei Co., Ltd.), as a polymerizable compound, and 1.6 parts by mass of PERCUMYL D (a polymerization initiator, manufactured by Nippon Oil and Fat Co., Ltd.) were added to the flask, and the resulting mixture was stirred for 30 minutes, to thus obtain a fluid coating solution for crosslinkable relief forming layer 1 (crosslinkable resin composition for laser engraving).

AC-1

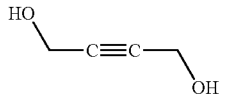

2. Production of Relief Printing Plate Precursor for Laser Engraving

A spacer (frame) having a predetermined thickness was installed on a PET substrate, and the coating solution for crosslinkable relief forming layer 1 obtained as described above was gently flow cast on the PET substrate to the extent that the coating solution would not flow out over the spacer (frame). The coating solution was dried in an oven at 70° C. for 3 hours, to provide a relief forming layer having a thickness of approximately 1 mm, and thus a relief printing plate precursor for laser engraving 1 was produced.

3. Production of Relief Printing Plate

The relief forming layer of the obtained printing plate precursor was heated at 120° C. for 2.5 hours to thermally crosslink the relief forming layer. On the relief forming layer after the crosslinking, a solid area with each side being 2 cm in length was engraved using a near-infrared laser engraving machine (trade name: FD-100, manufactured by Tosei Electrobeam Co., Ltd.) equipped with a semiconductor laser (laser emission wavelength 840 nm) having a maximum output power of 16 W, while the engraving conditions were set to laser power: 15 W, scanning rate: 100 mm/second, and pitch interval: 0.15 mm, to thereby form a relief layer, and thus a relief printing plate 1 was obtained.

The thickness of the relief layer of the relief printing plate 1 was approximately 1 mm. The Shore A hardness of the relief layer was measured by the above-described measurement method, and the hardness value was 85°. The measurement of Shore A hardness was carried out in the same manner in all of the Examples and Comparative Examples that will be described later.

Examples 2 to 4

1. Preparation of Crosslinkable Resin Composition for Laser Engraving

Coating solutions for crosslinkable relief forming layer 2 to 4 (crosslinkable resin compositions for laser engraving) were prepared in the same manner as in Example 1, except that 3 parts by mass of "AC-1" used as an acetylene compound in Example 1 was changed to 3 parts by mass of an acetylene compound as shown below.

Acetylene Compound

Example 2: AC-2 (having the following structure, manufactured by Wako Pure Chemical Industries, Ltd.)

Example 3: AC-3 (having the following structure, manufactured by Wako Pure Chemical Industries, Ltd.)

Example 4: AC-4 (having the following structure, manufactured by Wako Pure Chemical Industries, Ltd.)

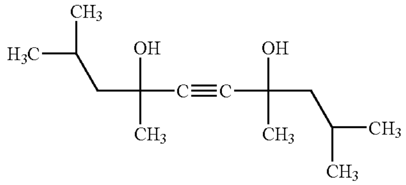

AC-2

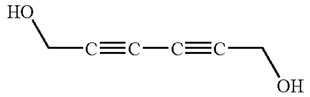

AC-3

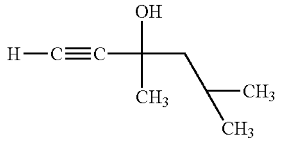

AC-4

2. Production of Relief Printing Plate Precursor for Laser Engraving

Relief printing plate precursors for laser engraving 2 to 4 were obtained in the same manner as in Example 1, except that the coating solution for crosslinkable relief forming layer 1 in Example 1 was changed to coating solutions for crosslinkable relief forming layer 2 to 4, respectively.

3. Production of Relief Printing Plate

Relief printing plates 2 to 4 were obtained in the same manner as in Example 1, by thermally crosslinking the relief forming layers of the relief printing plate precursors for laser engraving 2 to 4, and then performing engraving to form relief layers.

The thickness of the relief layers of the relief printing plates 2 to 4 was approximately 1 mm. Furthermore, the Shore A hardness values of the relief layers were 75° for the relief printing plate 2, 80° for the relief printing plate 3, and 87° for the relief printing plate 4.

Example 5

1. Preparation of Crosslinkable Resin Composition for Laser Engraving

A coating solution for crosslinkable relief forming layer 5 was prepared in the same manner as in Example 1, except that 25 parts by mass of "DPHA" used as a polymerizable compound in Example 1 was changed to a monomer having the following structure.

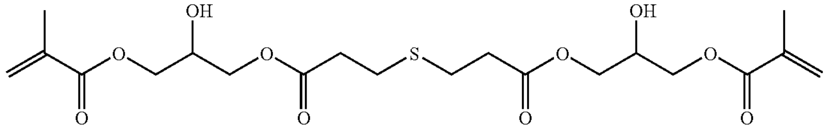

2. Production of Relief Printing Plate Precursor for Laser Engraving

A relief printing plate precursor for laser engraving 5 was obtained in the same manner as in Example 1, except that the coating solution for crosslinkable relief forming layer 1 in Example 1 was changed to a coating solution for crosslinkable relief forming layer 5.

3. Production of Relief Printing Plate

A relief printing plate 5 was obtained in the same manner as in Example 1, by thermally crosslinking the relief forming layer of the relief printing plate precursor for laser engraving 5, and then performing engraving to form a relief layer.

The thickness of the relief layer of the relief printing plate 5 was approximately 1 mm. The Shore A hardness of the relief layer of the relief printing plate 5 was 82°.

Example 6

1. Preparation of Crosslinkable Resin Composition for Laser Engraving

A coating solution for crosslinkable relief forming layer 6 was prepared in the same manner as in Example 5, except that 1 part by mass of KETJENBLACK EC600JD (carbon black) used as a photothermal conversion agent in the preparation of the coating solution for crosslinkable relief forming layer 5 in Example 5 was changed to 1 part by mass of ADS820HO (a cyanine compound, manufactured by American Dye Source, Inc.).

2. Production of Relief Printing Plate Precursor for Laser Engraving

A relief printing plate precursor for laser engraving 6 was obtained in the same manner as in Example 5, except that the coating solution for crosslinkable relief forming layer 5 in Example 5 was changed to a coating solution for crosslinkable relief forming layer 6.

3. Production of Relief Printing Plate

A relief printing plate 6 was obtained in the same manner as in Example 5, by thermally crosslinking the relief forming layer of the relief printing plate precursor for laser engraving 6, and then performing engraving to form a relief layer.

The thickness of the relief layer of the relief printing plate 6 was approximately 1 mm. The Shore A hardness of the relief layer of the relief printing plate 6 was 83°.

Example 7

1. Preparation of Crosslinkable Resin Composition for Laser Engraving

A coating solution for crosslinkable relief forming layer 7 was prepared in the same manner as in Example 5, except that 1 part by mass of KETJENBLACK EC600JD (carbon black) used as a photothermal conversion agent in the preparation of the coating solution for crosslinkable relief forming layer 5 in Example 5 was changed to 1 part by mass of D99-009 (a phthalocyanine-based compound, manufactured by Yamamoto Chemical Inc.).

2. Production of Relief Printing Plate Precursor for Laser Engraving

A relief printing plate precursor for laser engraving 7 was obtained in the same manner as in Example 5, except that the coating solution for crosslinkable relief forming layer 5 in Example 5 was changed to a coating solution for crosslinkable relief forming layer 7.

3. Production of Relief Printing Plate

A relief printing plate 7 was obtained in the same manner as in Example 5, by thermally crosslinking the relief forming layer of the relief printing plate precursor for laser engraving 7, and then performing engraving to form a relief layer.

The thickness of the relief layer of the relief printing plate 7 was approximately 1 mm. The Shore A hardness of the relief layer of the relief printing plate 7 was 78°.

Example 8

1. Preparation of Crosslinkable Resin Composition for Laser Engraving

A coating solution for crosslinkable relief forming layer 8 was prepared in the same manner as in Example 5, except that aquaPASS-01x (an electrically conductive polymer, manufactured by Mitsubishi Rayon Co., Ltd.) was further added to the system used in the preparation of the coating solution for crosslinkable relief forming layer 5 in Example 5, in a proportion of 3% by mass based on the total amount of the solid content.

2. Production of Relief Printing Plate Precursor for Laser Engraving

A relief printing plate precursor for laser engraving 8 was obtained in the same manner as in Example 5, except that the coating solution for crosslinkable relief forming layer 5 in Example 5 was changed to a coating solution for crosslinkable relief forming layer 8.

3. Production of Relief Printing Plate

A relief printing plate 8 was obtained in the same manner as in Example 5, by thermally crosslinking the relief forming layer of the relief printing plate precursor for laser engraving 8, and then performing engraving to form a relief layer.

The thickness of the relief layer of the relief printing plate 8 was approximately 1 mm. The Shore A hardness of the relief layer of the relief printing plate 8 was 84°.

Example 9

1. Preparation of Crosslinkable Resin Composition for Laser Engraving

A coating solution for crosslinkable relief forming layer 9 was prepared in the same manner as in Example 5, except that Panipol-F (an electrically conductive polymer, manufactured by Panipol Oy) was further added to the system used in the preparation of the coating solution for crosslinkable relief forming layer 5 in Example 5, in a proportion of 3% by mass based on the total amount of the solid content.

2. Production of Relief Printing Plate Precursor for Laser Engraving

A relief printing plate precursor for laser engraving 9 was obtained in the same manner as in Example 5, except that the coating solution for crosslinkable relief forming layer 5 in Example 5 was changed to a coating solution for crosslinkable relief forming layer 9.

3. Production of Relief Printing Plate

A relief printing plate 9 was obtained in the same manner as in Example 5, by thermally crosslinking the relief forming layer of the relief printing plate precursor for laser engraving 9, and then performing engraving to form a relief layer.

The thickness of the relief layer of the relief printing plate 9 was approximately 1 mm. The Shore A hardness of the relief layer of the relief printing plate 9 was 85°.

Examples 10 to 18

Relief printing plates 10 to 18 were produced in the same manner as in Examples 1 to 9 using the relief printing plate precursors for laser engraving 1 to 9 obtained in Examples 1 to 9, except that the laser for engraving used in the production of relief printing plate was changed from the semiconductor laser to a carbon dioxide laser, to perform engraving of the relief forming layer after crosslinking as shown below.

The engraving of the relief forming layer after crosslinking was performed by engraving a solid area with each side being 2 cm in length, using a carbon dioxide laser engraving machine (trade name: $CO_2$ LASER MARKER ML-Z9500, manufactured by Keyence Corporation) equipped with a carbon dioxide laser having a maximum output power of 30 W, while the engraving conditions were set to laser power: 15 W, scanning rate: 100 mm/second, and pitch interval: 0.15 mm.

Comparative Example 1

1. Preparation of Crosslinkable Resin Composition for Laser Engraving

A coating solution for crosslinkable relief forming layer A was prepared in the same manner as in Example 6, except that 3 parts by mass of the "AC-1" used in the preparation of the coating solution for crosslinkable forming layer 6 in Example 6 was not used, and that portion was supplemented with PVA.

2. Production of Relief Printing Plate Precursor for Laser Engraving

A relief printing plate precursor for laser engraving A was obtained in the same manner as in Example 6, except that the coating solution for crosslinkable relief forming layer 6 in Example 6 was changed to a coating solution for crosslinkable relief forming layer A.

3. Production of Relief Printing Plate

A relief printing plate A was obtained in the same manner as in Example 6, by thermally crosslinking the relief forming layer of the relief printing plate precursor for laser engraving A, and then performing engraving to form a relief layer.

The thickness of the relief layer of the relief printing plate A was approximately 1 mm. The Shore A hardness of the relief layer of the relief printing plate A was 93°.

Comparative Example 2

A relief printing plate B was obtained in the same manner as in Comparative Example 1, except that the laser for engraving used in the production of relief printing plate in Comparative Example 1 was changed from the semiconductor laser to the carbon dioxide laser used in Example 10.

Evaluation

Depth of Engraving

The "depth of engraving" of the relief layers of the relief printing plates 1 to 18, A and B were measured as follows. Here, the term "depth of engraving" means the difference in the position (height) where engraving has been applied, and the position (height) where engraving is not applied, when the cross-section of the relief layer is observed. The "depth of engraving" as used in the present Examples was measured by observing the cross-section of the relief layer with an ultra-deep color 3D profile measuring microscope (trade name: VK-9510, manufactured by Keyence Corporation). A large depth of engraving means high engraving sensitivity. The results are shown in Table 1.

TABLE 1

| | Relief printing plate | Laser for engraving | Depth of engraving (μm) |
|---|---|---|---|
| Example 1 | Relief printing plate 1 | Semiconductor laser | 400 |
| Example 2 | Relief printing plate 2 | Semiconductor laser | 400 |
| Example 3 | Relief printing plate 3 | Semiconductor laser | 425 |
| Example 4 | Relief printing plate 4 | Semiconductor laser | 425 |
| Example 5 | Relief printing plate 5 | Semiconductor laser | 445 |
| Example 6 | Relief printing plate 6 | Semiconductor laser | 445 |
| Example 7 | Relief printing plate 7 | Semiconductor laser | 445 |
| Example 8 | Relief printing plate 8 | Semiconductor laser | 455 |
| Example 9 | Relief printing plate 9 | Semiconductor laser | 455 |
| Example 10 | Relief printing plate 10 | $CO_2$ laser | 290 |
| Example 11 | Relief printing plate 11 | $CO_2$ laser | 290 |
| Example 12 | Relief printing plate 12 | $CO_2$ laser | 310 |
| Example 13 | Relief printing plate 13 | $CO_2$ laser | 310 |
| Example 14 | Relief printing plate 14 | $CO_2$ laser | 330 |
| Example 15 | Relief printing plate 15 | $CO_2$ laser | 330 |
| Example 16 | Relief printing plate 16 | $CO_2$ laser | 330 |
| Example 17 | Relief printing plate 17 | $CO_2$ laser | 345 |
| Example 18 | Relief printing plate 18 | $CO_2$ laser | 345 |
| Comparative Example 1 | Relief printing plate A | Semiconductor laser | 380 |
| Comparative Example 2 | Relief printing plate B | $CO_2$ laser | 250 |

As shown in Table 1, it was found that the relief printing plates of Examples, which were produced using resin compositions for laser engraving containing an acetylene compound, had large depths of engraving as compared to the relief printing plates of Comparative Examples, which did not use any acetylene compound. From these results, it was verified that the resin compositions for laser engraving prepared in the Examples had high engraving sensitivity.

All publications, patent applications, and technical standards mentioned in this specification are herein incorporated by reference to the same extent as if each individual publication, patent application, or technical standard was specifically and individually indicated to be incorporated by reference.

What is claimed is:

1. A relief printing plate precursor for laser engraving, comprising: a relief forming layer including a resin composition, the resin composition comprising:

an acetylene compound;

a binder polymer;

a polymerizable compound; and a photothermal conversion agent which is capable of absorbing light in a wavelength range of 700 to 1300 nm, wherein the photothermal conversion agent comprises carbon black, wherein each of the acetylene compound, the binder polymer, the polymerizable compound and the photothermal conversion agent is a different component of the resin composition, and wherein the acetylene compound includes a carbon-carbon triple bond positioned at an end of a molecule of the acetylene compound or two carbon-carbon triple bonds positioned at an interior of a molecule of the acetylene compound.

2. The resin composition for laser engraving of claim 1, wherein the binder polymer is a hydrophilic polymer.

3. The resin composition for laser engraving of claim 2, wherein the hydrophilic polymer is a polymer selected from the group consisting of polyvinyl alcohol and derivatives thereof.

4. A method for producing a relief printing plate, the method comprising:

crosslinking the relief forming layer in the relief printing plate precursor for laser engraving of claim 1 by at least one of light or heat; and laser engraving the crosslinked relief forming layer to form a relief layer.

5. The method for producing a relief printing plate of claim 4, wherein the crosslinking of the relief forming layer is carried out by crosslinking the relief forming layer by heat.

6. A relief printing plate comprising: a relief layer, the relief layer comprising a crosslinked and laser engraved relief forming layer of the printing plate precursor of claim 1, wherein the Shore A hardness of the relief layer is from 50° to 90°.

7. The relief printing plate of claim 6, wherein the thickness of the relief layer is from 0.05 mm to 10 mm.

* * * * *